US008274777B2

(12) United States Patent
Kiehlbauch

(10) Patent No.: US 8,274,777 B2
(45) Date of Patent: Sep. 25, 2012

(54) HIGH ASPECT RATIO OPENINGS

(75) Inventor: Mark W. Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1205 days.

(21) Appl. No.: 12/099,577

(22) Filed: Apr. 8, 2008

(65) Prior Publication Data
US 2009/0251845 A1    Oct. 8, 2009

(51) Int. Cl.
H01G 4/00 (2006.01)
(52) U.S. Cl. ........... 361/301.1; 361/301.2; 361/303; 361/305; 361/311; 361/312
(58) Field of Classification Search .......... 361/301.2, 361/301.4, 311–313, 303–305, 321.1, 321.2; 438/243, 254, 255, 395–397
See application file for complete search history.

(56) References Cited

U.S. PATENT DOCUMENTS

| 4,517,729 | A | 5/1985 | Batra |
| 4,705,659 | A | 11/1987 | Bernstein et al. |
| 5,155,657 | A | 10/1992 | Oehrlein et al. |
| 5,236,860 | A | 8/1993 | Fazan et al. |
| 5,340,763 | A | 8/1994 | Dennison |
| 5,401,681 | A | 3/1995 | Dennison |
| 5,467,305 | A | 11/1995 | Bertin et al. |
| 5,498,562 | A | 3/1996 | Dennison et al. |
| 5,532,089 | A | 7/1996 | Adair et al. |
| 5,604,696 | A | 2/1997 | Takaishi |
| 5,605,857 | A | 2/1997 | Jost et al. |
| 5,652,164 | A | 7/1997 | Dennison et al. |
| 5,654,222 | A | 8/1997 | Sandhu et al. |
| 5,686,747 | A | 11/1997 | Jost et al. |
| 5,702,990 | A | 12/1997 | Jost et al. |
| 5,705,838 | A | 1/1998 | Jost et al. |
| 5,767,561 | A | 6/1998 | Frei et al. |
| 5,784,112 | A | 7/1998 | Ogasawara et al. |
| 5,821,140 | A | 10/1998 | Jost et al. |
| 5,869,382 | A | 2/1999 | Kubota |
| 5,900,660 | A | 5/1999 | Jost et al. |
| 5,955,758 | A | 9/1999 | Sandhu et al. |
| 5,981,350 | A | 11/1999 | Geusic et al. |
| 5,981,992 | A | 11/1999 | Calpine Kenney |

(Continued)

FOREIGN PATENT DOCUMENTS

DE    4447804    1/2011

(Continued)

OTHER PUBLICATIONS

International Search Report and Written Opinion for related PCT Application PCT/US2009/001693, dated Nov. 9, 2009 (12 pgs.).

(Continued)

Primary Examiner — Nguyen T Ha
(74) Attorney, Agent, or Firm — Brooks, Cameron & Huebsch, PLLC

(57) ABSTRACT

A capacitor forming method includes forming an electrically conductive support material over a substrate, with the support material containing at least 25 at % carbon. The method includes forming an opening through at least the support material where the opening has an aspect ratio of at least 20:1 within a thickness of the support material. After forming the opening, the method includes processing the support material to effect a reduction in conductivity, and forming a capacitor structure in the opening.

17 Claims, 10 Drawing Sheets

U.S. PATENT DOCUMENTS

| | | | |
|---|---|---|---|
| 5,990,021 A | 11/1999 | Prall et al. | |
| 6,015,990 A | 1/2000 | Hieda et al. | |
| 6,037,212 A | 3/2000 | Chao | |
| 6,037,218 A | 3/2000 | Dennison et al. | |
| 6,059,553 A | 5/2000 | Jin et al. | |
| 6,090,700 A | 7/2000 | Tseng | |
| 6,108,191 A | 8/2000 | Bruchhaus et al. | |
| 6,110,774 A | 8/2000 | Jost et al. | |
| 6,133,620 A | 10/2000 | Uochi | |
| 6,159,818 A | 12/2000 | Durcan et al. | |
| 6,180,450 B1 | 1/2001 | Dennison | |
| 6,204,143 B1 | 3/2001 | Roberts et al. | |
| 6,204,178 B1 | 3/2001 | Marsh | |
| 6,249,019 B1 | 6/2001 | Sandhu et al. | |
| 6,258,650 B1 | 7/2001 | Sunouchi | |
| 6,274,497 B1 | 8/2001 | Lou | |
| 6,294,425 B1 | 9/2001 | Hideki | |
| 6,303,518 B1 | 10/2001 | Tian et al. | |
| 6,303,956 B1 | 10/2001 | Sandhu et al. | |
| 6,323,528 B1 | 11/2001 | Yamazaki et al. | |
| 6,331,461 B1 | 12/2001 | Juengling | |
| 6,372,554 B1 | 4/2002 | Kawakita et al. | |
| 6,372,574 B1 | 4/2002 | Lane et al. | |
| 6,383,861 B1 | 5/2002 | Gonzalez et al. | |
| 6,399,490 B1 | 6/2002 | Jammy et al. | |
| 6,403,442 B1 | 6/2002 | Reinberg | |
| 6,432,472 B1 | 8/2002 | Farrell et al. | |
| 6,458,653 B1 | 10/2002 | Jang | |
| 6,458,925 B1 | 10/2002 | Fasano | |
| 6,459,138 B2 | 10/2002 | Reinberg | |
| 6,475,855 B1 | 11/2002 | Fishburn | |
| 6,476,432 B1 | 11/2002 | Basceri et al. | |
| 6,482,749 B1 | 11/2002 | Billington et al. | |
| 6,599,794 B2 | 7/2003 | Kiyotoshi et al. | |
| 6,613,669 B2 | 9/2003 | Taguwa | |
| 6,617,222 B1 | 9/2003 | Coursey | |
| 6,620,680 B2 | 9/2003 | Durcan et al. | |
| 6,620,724 B1* | 9/2003 | Schroeder et al. | 438/628 |
| 6,645,869 B1 | 11/2003 | Chu et al. | |
| 6,656,748 B2 | 12/2003 | Hall et al. | |
| 6,667,502 B1 | 12/2003 | Agarwal et al. | |
| 6,673,693 B2 | 1/2004 | Kirchhoff | |
| 6,696,745 B2 | 2/2004 | Sandhu et al. | |
| 6,699,749 B1 | 3/2004 | Lee et al. | |
| 6,707,088 B2 | 3/2004 | Fishburn | |
| 6,709,978 B2 | 3/2004 | Geusic et al. | |
| 6,720,232 B1 | 4/2004 | Tu et al. | |
| 6,767,789 B1 | 7/2004 | Bronner et al. | |
| 6,784,112 B2 | 8/2004 | Arita et al. | |
| 6,784,479 B2 | 8/2004 | Park | |
| 6,787,833 B1 | 9/2004 | Fishburn | |
| 6,812,513 B2 | 11/2004 | Geusic et al. | |
| 6,822,261 B2 | 11/2004 | Mase et al. | |
| 6,822,280 B2 | 11/2004 | Ito et al. | |
| 6,844,230 B2 | 1/2005 | Reinberg | |
| 6,849,496 B2 | 2/2005 | Jaiprakash et al. | |
| 6,853,023 B2 | 2/2005 | Goebel | |
| 6,855,408 B2 | 2/2005 | Shimomura et al. | |
| 6,861,330 B2 | 3/2005 | Basceri et al. | |
| 6,890,814 B2 | 5/2005 | Sandhu et al. | |
| 6,893,914 B2 | 5/2005 | Kim et al. | |
| 6,897,109 B2 | 5/2005 | Jin et al. | |
| 6,927,122 B2 | 8/2005 | Geusic et al. | |
| 6,927,170 B2 | 8/2005 | Zheng | |
| 6,930,640 B2 | 8/2005 | Chung et al. | |
| 6,936,880 B2 | 8/2005 | Park | |
| 6,939,794 B2 | 9/2005 | Yin et al. | |
| 6,962,846 B2 | 11/2005 | Fishburn et al. | |
| 6,991,980 B2 | 1/2006 | Park | |
| 7,005,379 B2 | 2/2006 | Sinha et al. | |
| 7,037,808 B2 | 5/2006 | Jiang et al. | |
| 7,042,040 B2 | 5/2006 | Horiguchi | |
| 7,053,435 B2 | 5/2006 | Yeo et al. | |
| 7,053,453 B2 | 5/2006 | Tsao et al. | |
| 7,064,028 B2 | 6/2006 | Ito et al. | |
| 7,064,365 B2 | 6/2006 | An et al. | |
| 7,071,055 B2 | 7/2006 | Fishburn | |
| 7,073,969 B2 | 7/2006 | Kamm | |
| 7,074,669 B2 | 7/2006 | Iijima et al. | |
| 7,081,384 B2 | 7/2006 | Birner et al. | |
| 7,084,451 B2 | 8/2006 | Forbes et al. | |
| 7,095,095 B2 | 8/2006 | Jiang et al. | |
| 7,125,781 B2 | 10/2006 | Manning et al. | |
| 7,153,778 B2 | 12/2006 | Busch et al. | |
| 7,160,788 B2 | 1/2007 | Sandhu et al. | |
| 7,179,706 B2 | 2/2007 | Patraw et al. | |
| 7,199,005 B2 | 4/2007 | Sandhu et al. | |
| 7,202,127 B2 | 4/2007 | Busch et al. | |
| 7,223,690 B2 | 5/2007 | Kondo et al. | |
| 7,226,845 B2 | 6/2007 | Manning et al. | |
| 7,235,441 B2 | 6/2007 | Yasui et al. | |
| 7,235,479 B2 | 6/2007 | Verhaverbeke | |
| 7,235,485 B2 | 6/2007 | Kwak et al. | |
| 7,268,034 B2 | 9/2007 | Basceri et al. | |
| 7,268,039 B2 | 9/2007 | Fishburn et al. | |
| 7,273,779 B2 | 9/2007 | Fishburn et al. | |
| 7,279,379 B2 | 10/2007 | Tran et al. | |
| 7,282,756 B2 | 10/2007 | Agarwal et al. | |
| 7,288,806 B2 | 10/2007 | Tran et al. | |
| 7,320,911 B2 | 1/2008 | Basceri et al. | |
| 7,321,149 B2 | 1/2008 | Busch et al. | |
| 7,321,150 B2 | 1/2008 | Fishburn et al. | |
| 7,335,935 B2 | 2/2008 | Sinha et al. | |
| 7,341,909 B2 | 3/2008 | McDaniel et al. | |
| 7,384,847 B2 | 6/2008 | Tran et al. | |
| 7,387,939 B2 | 6/2008 | Manning | |
| 7,393,741 B2 | 7/2008 | Sandhu et al. | |
| 7,393,743 B2 | 7/2008 | Manning | |
| 7,402,488 B2* | 7/2008 | Cho et al. | 438/253 |
| 7,413,952 B2 | 8/2008 | Busch et al. | |
| 7,439,152 B2 | 10/2008 | Manning | |
| 7,440,255 B2 | 10/2008 | McClure et al. | |
| 7,442,600 B2 | 10/2008 | Wang et al. | |
| 7,445,990 B2 | 11/2008 | Busch et al. | |
| 7,445,991 B2 | 11/2008 | Manning | |
| 7,449,391 B2 | 11/2008 | Manning et al. | |
| 7,517,754 B2 | 4/2009 | McDaniel et al. | |
| 7,534,694 B2 | 5/2009 | Manning | |
| 7,538,036 B2 | 5/2009 | Busch et al. | |
| 7,573,088 B2 | 8/2009 | Juengling | |
| 7,576,441 B2 | 8/2009 | Yin et al. | |
| 7,638,392 B2 | 12/2009 | Wang et al. | |
| 7,781,883 B2* | 8/2010 | Sri-Jayantha et al. | 257/712 |
| 2001/0012223 A1 | 8/2001 | Kohyama | |
| 2001/0026974 A1 | 10/2001 | Reinberg | |
| 2001/0044181 A1 | 11/2001 | Nakamura | |
| 2002/0022339 A1 | 2/2002 | Kirchhoff | |
| 2002/0030221 A1 | 3/2002 | Sandhu et al. | |
| 2002/0039826 A1 | 4/2002 | Reinberg | |
| 2002/0090779 A1 | 7/2002 | Jang | |
| 2002/0098654 A1 | 7/2002 | Durcan et al. | |
| 2002/0153589 A1 | 10/2002 | Oh | |
| 2002/0153614 A1 | 10/2002 | Ema et al. | |
| 2002/0163026 A1 | 11/2002 | Park | |
| 2003/0017669 A1 | 1/2003 | Kiyotoshi et al. | |
| 2003/0085420 A1 | 5/2003 | Ito et al. | |
| 2003/0153146 A1 | 8/2003 | Won et al. | |
| 2003/0178684 A1 | 9/2003 | Nakamura | |
| 2003/0190782 A1 | 10/2003 | Ko et al. | |
| 2003/0227044 A1 | 12/2003 | Park | |
| 2004/0011653 A1 | 1/2004 | Collins et al. | |
| 2004/0018679 A1 | 1/2004 | Yu et al. | |
| 2004/0036051 A1 | 2/2004 | Sneh | |
| 2004/0150070 A1 | 8/2004 | Okada et al. | |
| 2004/0188738 A1 | 9/2004 | Farnworth et al. | |
| 2004/0238864 A1 | 12/2004 | Tripsas et al. | |
| 2004/0259355 A1 | 12/2004 | Yin et al. | |
| 2004/0262744 A1 | 12/2004 | Dahl et al. | |
| 2005/0023588 A1 | 2/2005 | Sandhu et al. | |
| 2005/0029515 A1 | 2/2005 | Nagai et al. | |
| 2005/0032357 A1 | 2/2005 | Rantala et al. | |
| 2005/0041357 A1 | 2/2005 | Grigorov et al. | |
| 2005/0051822 A1 | 3/2005 | Manning | |
| 2005/0158949 A1 | 7/2005 | Manning | |
| 2005/0176210 A1 | 8/2005 | Kim et al. | |
| 2005/0221606 A1 | 10/2005 | Lee et al. | |
| 2005/0287738 A1 | 12/2005 | Cho et al. | |

| | | | |
|---|---|---|---|
| 2005/0287780 A1 | 12/2005 | Manning et al. | |
| 2005/0287795 A1 | 12/2005 | Torek et al. | |
| 2006/0006502 A1 | 1/2006 | Yin et al. | |
| 2006/0014344 A1 | 1/2006 | Manning | |
| 2006/0024958 A1 | 2/2006 | Ali | |
| 2006/0046420 A1 | 3/2006 | Manning | |
| 2006/0063344 A1 | 3/2006 | Manning et al. | |
| 2006/0063345 A1 | 3/2006 | Manning et al. | |
| 2006/0110610 A1 | 5/2006 | Matsutani et al. | |
| 2006/0115951 A1 | 6/2006 | Mosley | |
| 2006/0115952 A1 | 6/2006 | Wu | |
| 2006/0121672 A1 | 6/2006 | Basceri et al. | |
| 2006/0145306 A1 | 7/2006 | Lee et al. | |
| 2006/0148190 A1 | 7/2006 | Busch | |
| 2006/0176210 A1 | 8/2006 | Nakamura et al. | |
| 2006/0186451 A1 | 8/2006 | Dusberg et al. | |
| 2006/0199330 A1 | 9/2006 | Nakamura et al. | |
| 2006/0211211 A1 | 9/2006 | Sandhu et al. | |
| 2006/0237762 A1 | 10/2006 | Park | |
| 2006/0249798 A1 | 11/2006 | Manning | |
| 2006/0258327 A1 | 11/2006 | Lee et al. | |
| 2006/0261440 A1 | 11/2006 | Manning | |
| 2006/0263968 A1 | 11/2006 | Manning | |
| 2007/0001208 A1 | 1/2007 | Graham et al. | |
| 2007/0032014 A1 | 2/2007 | Sandhu et al. | |
| 2007/0032035 A1 | 2/2007 | Durcan et al. | |
| 2007/0045699 A1 | 3/2007 | Liao et al. | |
| 2007/0045799 A1 | 3/2007 | Sekiya | |
| 2007/0048976 A1 | 3/2007 | Raghu | |
| 2007/0057304 A1 | 3/2007 | Boescke et al. | |
| 2007/0093022 A1 | 4/2007 | Basceri | |
| 2007/0099328 A1 | 5/2007 | Chiang et al. | |
| 2007/0099423 A1 | 5/2007 | Chen et al. | |
| 2007/0134872 A1 | 6/2007 | Sandhu et al. | |
| 2007/0145009 A1 | 6/2007 | Fucsko et al. | |
| 2007/0148984 A1 | 6/2007 | Abatchev et al. | |
| 2007/0196978 A1 | 8/2007 | Manning | |
| 2007/0202686 A1 | 8/2007 | Dixit et al. | |
| 2007/0207622 A1 | 9/2007 | Rana et al. | |
| 2007/0228427 A1 | 10/2007 | Matsui et al. | |
| 2007/0238259 A1 | 10/2007 | Bhat | |
| 2007/0257323 A1 | 11/2007 | Tsui et al. | |
| 2007/0278552 A1 | 12/2007 | Clampitt | |
| 2007/0281434 A1 | 12/2007 | Ahn et al. | |
| 2008/0014694 A1 | 1/2008 | Bhat et al. | |
| 2008/0048188 A1 | 2/2008 | Pei | |
| 2008/0083920 A1 | 4/2008 | Lee | |
| 2008/0090416 A1 | 4/2008 | Raghu et al. | |
| 2008/0171137 A1 | 7/2008 | Kim et al. | |
| 2009/0047769 A1 | 2/2009 | Bhat et al. | |
| 2009/0176011 A1* | 7/2009 | Kiehlbauch | 427/79 |
| 2009/0251845 A1 | 10/2009 | Kiehlbauch | |
| 2009/0275185 A1 | 11/2009 | Shea et al. | |
| 2009/0275187 A1 | 11/2009 | Kiehlbauch et al. | |
| 2010/0041204 A1* | 2/2010 | Kiehlbauch et al. | 438/397 |

FOREIGN PATENT DOCUMENTS

| | | |
|---|---|---|
| JP | 4-155810 | 5/1992 |
| JP | 1996-27428 | 10/1996 |
| JP | 1998-189912 | 7/1998 |
| JP | 1999-191615 | 7/1999 |
| JP | 2000-196038 | 7/2000 |
| JP | 2003-142605 | 5/2003 |
| JP | 2003-264246 | 9/2003 |
| JP | 2003-273247 | 9/2003 |
| JP | 2003-297952 | 10/2003 |
| JP | 2005-072078 | 3/2004 |
| JP | 2004-111626 | 4/2004 |
| JP | 2004-128463 | 4/2004 |
| JP | 2005008864 | 1/2005 |
| JP | 2004-032982 | 2/2005 |
| JP | 2006-135364 | 5/2006 |
| KR | 20010005150 | 1/2001 |
| KR | 20010061020 | 7/2001 |
| KR | 20010014003 | 12/2001 |
| KR | 1020010108963 | 12/2001 |
| KR | 20020006364 | 1/2002 |
| KR | 100327123 | 2/2002 |
| KR | 1020030058018 | 7/2003 |
| KR | 20040004812 | 1/2004 |
| KR | 20040091322 | 10/2004 |
| KR | 20040102410 | 12/2004 |
| KR | 1020050000896 | 1/2005 |
| KR | 20050022170 | 3/2005 |
| KR | 1005202230000 | 10/2005 |
| KR | 100656283 B1 | 12/2006 |
| KR | 1020060134344 A | 12/2006 |
| KR | 10-2007-0098341 A | 10/2007 |
| KR | 1020070110747 A | 11/2007 |
| KR | 10-2008-0001157 A | 1/2008 |
| KR | 102100004648 A | 1/2010 |
| WO | WO2005/024936 | 3/2005 |
| WO | WO2008040706 | 4/2008 |

OTHER PUBLICATIONS

Andreaskis, John, et al. "Performance of Polymeric Ultra-thin Susbstrates . . . ," 2004 IEEE Electronic Components and Technology Conference, pp. 289-293. (2004).

Black, C.T. "Integration of Self Assemby for Semiconductor Microelectronics," 2005 IEEE Custom Integrated Circuits Conference, pp. 87-91. (2005).

Chao, Tien-Sheng, et al. "CoTiO3 High-k Dielectrics on HSG for DRAM Applications," IEEE Tranasctions on Electron Devices, vol. 51, No. 12, Dec. 2004, pp. 2200-2204.

Cho, Sung-Dung, et al. "Epoxy/BaTiO3 Composite Films and Pastes . . . ," IEEE Transactions on Electronics Packaging Manufacturing, vol. 28, No. 4, Oct. 2005, pp. 297-303.

Doraiswami, Ravi, et al. "Shape Memory Capacitors for Next Generation Embedded Actives," 2006 IEEE Electronic Components and Technology Conference, pp. 520-522. (2006).

Li Li, et al. "Novel Polymer-Ceramic Nanocomposite . . . ," IEEE Transactions on Components and Packaging Technologies, vol. 28, No. 4, Dec. 2005. pp. 754-759.

Liao, E.B., et al. "Novel Integration of Metal-Insulator-Metal (Mim) . . . ," IEEE Electron Device Letters, vol. 29, No. 1, Jan. 2008, pp. 31-33.

Ramesh, Sivarajan, et al. "Dielectric Nanocomposites for Integral Thin Film Capacitors . . . ," IEEE Transactions on Advanced Packaging, vol. 26, No. 1, Feb. 2003, pp. 17-24.

PCT/US2004/027898, Feb. 28, 2005, Written Opinion.
PCT/US2004/027898, Feb. 28, 2005, Search Report.
PCT/US2004/040252, May 25, 2005, Written Opinion.
PCT/US2004/040252, May 25, 2005, Search Report.
PCT/US2006/006806, Jul. 26, 2006, Written Opinion.
PCT/US2006/006806, Jul. 26, 2006, Search Report.
PCT/US2006/006806, Mar. 7, 2011, IPER.
PCT/US2008/070071, Jul. 7, 2009, IPRP.
PCT/US2008/070071, Jul. 7, 2009, Written Opinion.
PCT/US2008/070071, Jul. 7, 2009, Search Report.
PCT/US2009/046946, Jan. 20, 2011, IPRP.

Banhart., "Aluminum Foams: on the road to real applications", MRS Bulletin, Apr. 2003, pp. 290-295.

Crouse et al., "Self-Assembled Nanostructures Using Anodized Alunmina Thin Films for Optoelectronic applications", IEEE, pp. 234-235,1999.

Gibson et al., "Cellular Solids", MRS Bulletin, Apr. 2003, pp. 270-274.

Green et al., "Cellular Ceramics: Intriguing Structures, Novel Properties, and Innovative Applications", MRS Bulletin, Apr. 2003, pp. 296-300.

Green et al., "The Structure and Applications of Cellular Ceramics", MRS Bulletin, Apr. 2003, 10 pages.

Karp et al., "Scaffolds for Tissue Engineering", MRS Bulletin, Apr. 2003, pp. 301-302.

Kim et al., "A mechanically enhanced storage node for virtually unlimited height (MESH) capacitor aiming at sub 70nm DRAMs", IEEE, Jan. 2004, pp. 69-72.

Konovalov et al., "Chemistry of Materials", Chem. Mater., vol. 11, No. 8, pp. 1949-1951 (Aug. 1999).

Kraynik, "Foam Structure: From Soap Froth to Solid Foams", MRS Bulletin, Apr. 2003, pp. 275-278.

Li., "Metal-assisted chemical etching in HF/H202 produces porous silicon", Applied Physics Letters, vol. 77, No. 16, Oct. 16, 20000, pp. 2572-2574.

Liang et al., "Nonlithographic Fabrication of Lateral Superlattices for Nanometric Electromagnetic-Optic . . . ", IEEE J. Selected Topics in Quantum Electr., vol. 8, No. 5, pp. 998-1008 (SepUOct 2002).

Liu et al., "Ordered anodic alumina nanochannels on focused-ion-beam-prepatterned aluminum surfaces", appl. Phys. Lett. vol. 78, No. 1, pp. 120-122 (Jan. 2001).

Maire et al., "In Situ X-Ray tomography Measurements of Deformatio in Sellular Solids", MRS Bulletin, Apr. 2003, pp. 284-289.

Masuda et al., "Highly ordered nanochannel-array architecture in anodic alumina", App. Phys. Lett, vol. 71, No. 19, Nov. 1997, pp. 2770-2772.

Nadeem et al., "Fabrication of Microstructures Using Aluminum Anodization Techniques", pre-2004, pp. 274-277.

Oh et al., "Preparation and Pore-Characteristics Control of Nano-Porous Materials Using Organometallic Building Blocks", Carbon Science, vol. 4, No. 1, Mar. 2003, pp. 1-9.

Onch, "Scale Effects in Cellular Metals", MRS Bulletin, Apr. 2003, pp. 279-283.

O'Sullivan et al., "The Morphology and Mechanism of Formation of Porous Anodic Films on Aluminum", Proc. Roy. Soc. Lond. A, vol. 317, 1970, pp. 511-543.

Park et al., "Block Copolymer Lithography: Periodic Arrays of—1011 Holes in 1 Square Centimeter", Science, vol. 276, May 1997, pp. 1401-1404.

Park et al., "Novel Robust Cell Capacitor (Leaning Exterminated Ring Type Insulator) and New Storage Node Contact", IEEE, 2004 Symposium on VLSI Technology Digest of Technical Papers, pp. 34-35.

Shingubara, "Fabrication of nanomaterials using porous aluina templates", J. Nanoparticle Res., vol. 5, 2003, pp. 17-30.

Tan et al., "High Aspect Ratio Micronstructures on Porous Anodic Aluminum Oxide", IEEE, 1995, pp. 267-272.

Tsukada et al., "Preparation and Application of Porous Silk Fibroin Materials", J. Appl. POlymer Sci., vol. 54,1994, pp. 507-514.

Yasaitis et al., "A modular process for integrating thick pOlysilicon MEMS devices with submicron CMOS", Analog Devices, Pre-2004.

* cited by examiner

US 8,274,777 B2

HIGH ASPECT RATIO OPENINGS

TECHNICAL FIELD

The invention relates to semiconductors and semiconductor fabrication methods. More particularly, the invention relates to high aspect ratio openings and etching methods for formation of high aspect ratio openings.

BACKGROUND

Openings are formed in support materials so that microelectronic structures may be formed in and their structure supported by the support material. For example, a capacitor container for a dynamic random access memory (DRAM) cell may be etched into a dielectric, such as silicon dioxide ($SiO_2$), which can be formed as a doped silicate glass. Use of silicon dioxide dielectric can yield several disadvantages from an etching standpoint. Dry etch of silicon dioxide has a large physical component, that is, it is more like physical sputtering than like a chemical etch. Its sputtering nature creates difficulty in obtaining a straight profile since the etch does not exhibit a lateral component, leading to a tapered profile.

The profile of an opening is of particular importance. The need for accurately and precisely locating openings is in relation to other structures is exemplified where contact holes or vias are provided between devices. The profile of an opening is also important where several adjacent openings are used to form vertical capacitive structures. As the feature dimensions of devices decrease, the aspect ratio (the ratio of depth to width) of the openings tend to increase. As the aspect ratio increases, however, a phenomenon termed "twisting" can occur.

In addition to tapered etch profiles, use of silicon dioxide also may produce feature charging due to its insulative nature. Consequently, the top of a feature, such as an opening in the silicon dioxide, charges negatively relative to the bottom of the feature. Computer simulation has shown the resulting vertical potential gradient as high as several hundred volts, for example, 200 to 300 volts. Such a gradient may retard the flux of positive ions that produce the etching effect and contribute to aspect ratio dependent (ARD) etch, also known as reactive ion etch (RIE) lag. As a result, as aspect ratio increases, etching may become less effective.

Due to the physical component involved in a dry etch process of silicon dioxide ($SiO_2$), it is also possible for a lateral potential gradient to exist. Features across a surface being etched might not be symmetrical, resulting in feature charging differences in lateral directions. Feature asymmetries may result from incoming photo irregularities, asymmetries at the edge of an array compared to the center of an array, or the stochastic nature of plasma polymer deposition. Photo irregularities become apparent on inspection after the development step during photolithography.

While a vertical electric field is responsible for aspect ratio dependent etching (ARDE), a lateral potential gradient, i.e., electric field, may orient the flux of positive ions away from true vertical, leading to so-called twisting of etched features. Twisting occurs when the etch front of the opening starts deviating from what is perpendicular to the semiconductor substrate surface, for example, openings in the shape of a corkscrew are possible. Twisting may become especially noticeable in high aspect ratio (HAR) features. When etching a HAR or other feature, openings may deflect laterally from true vertical.

The twisting phenomenon with respect to HAR openings is problematic in that twisting reduces the efficiency of a contact by increasing the distance between active device areas and by increasing the difficulty of filling a contact with a conductive material, or can weaken or distort vertical structures formed by etching. Such twisting may cause electrical opens when the opening misses a landing contact, or may cause electrical shorts when the opening twists into an adjacent feature, or may cause unwanted variations in deposition layers upon distorted vertical structures.

DETAILED DESCRIPTION

Figure 1A:
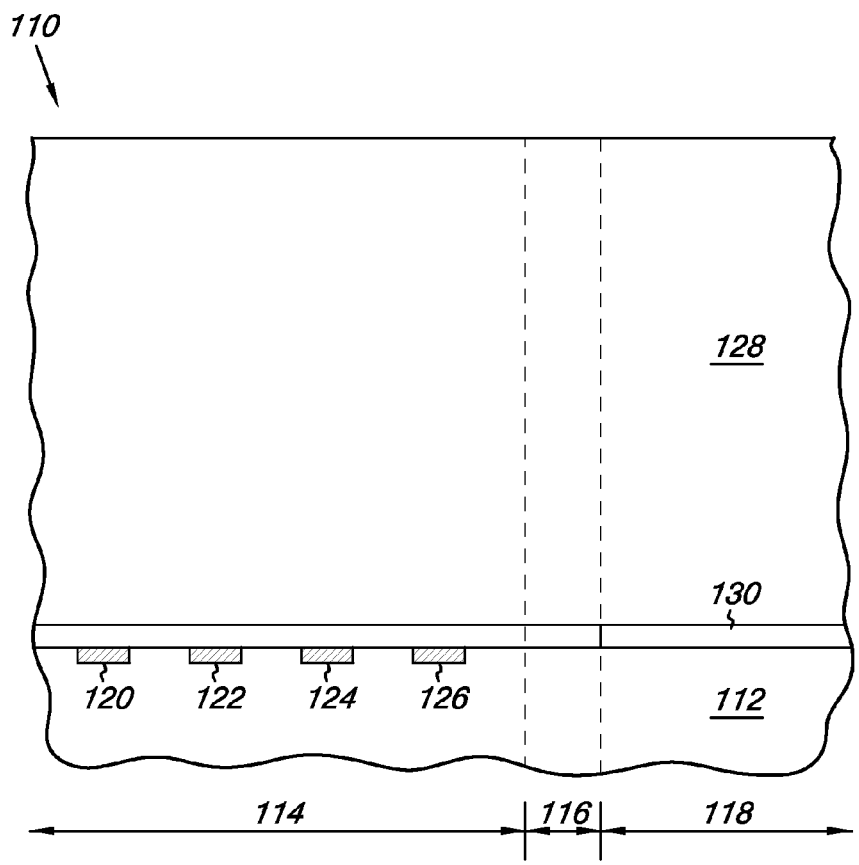
FIG. 1A is a diagrammatic, cross-sectional view of a portion of a semiconductor wafer comprising the cross-section shown in FIG. 1B along the line 1A-1A.

The present disclosure includes methods, capacitors, and high aspect ratio (HAR) structures, e.g., openings, vertical features. One method embodiment of a capacitor forming method includes forming an electrically conductive support material over a substrate, with the support material containing at least 25 atomic percent (at %) carbon. The method includes forming an opening through at least the support material where the opening has an aspect ratio of at least 20:1 within a thickness of the support material. After forming the opening, the method includes processing the support material to effect a reduction in conductivity, and forming a capacitor structure in the opening.

In memory devices and other semiconductor-based circuitry, capacitors, e.g., MBit capacitors, are typically etched into substrates, followed by deposition of cell plates and dielectrics, e.g., charge-separating layers. In previous approaches, fabrication of capacitors includes formation in dielectric films, as well as conductive films.

Dielectric films provide electrical isolation, particularly between periphery devices. However, dielectric films are difficult to etch due to their generally refractory nature and feature charging, e.g., the top of a feature being negatively charged, while the bottom of a feature being positively charged. Etching dielectric films is primarily physically driven by high energy ion bombardment. Vertical electric fields resulting from feature charging tend to repel positive ions from the bottom of the feature, reducing etch rate and causing overly tapered feature profiles, among other defects. Lateral electric fields resulting from feature charging, arising for example from mask irregularities and/or the stochastic nature of plasma etching, can result in feature twisting or other feature irregularities.

Conductive films on the other hand, are easier to etch at high aspect ratios (ARs) with chemically driven plasma. The chemically driven plasma is not subject to electric field-induced feature distortion such as twisting. For example, production of approximately 70:1 AR capacitors formed in crystalline, i.e., conductive, silicon have been demonstrated without twisting, with ARs in excess of 100:1 possible. However after etching capacitor features, the conductive materials generally must be stripped out and replaced with a dielectric, e.g., having reduced conductivity, to provide insulation for separating electrical charges within the capacitor.

According to one or more embodiments of the present disclosure, semiconductor fabrication of various features include deposition of an initially-conductive material, which is subsequently processed, e.g., after capacitor feature formation, to effect a change in the conductivity of the material, e.g., reduce conductivity of the material such that it may be utilized as a capacitor dielectric for electrical isolation of the conductive charge-carrying plates. In this manner, the advantages associated with the chemically driven plasma etching characteristics of a conductive material may be realized in feature formation, without having to subsequently remove the conductive material and replace it with another, more insulative, material. Utilizing support material with initially-conductive properties may reduce the tapered nature of etch profiles, ARD etch, and feature twisting. Thereafter, the property of the material is changed from an initially more conductive state, to a less conductive state. In the less conductive state, the support material may serve as the insulation between capacitor structures for example. Thus, the same material achieves the advantages associated with etching conductive material, as well as those associated with isolating devices with non-conductive material, without the inefficiencies associated with having to form, remove, and replace several materials during fabrication.

Such a change, e.g., reduction, in material conductivity, from conductor to dielectric, is referred to herein as an electrical phase change. An electrical phase change is not to be confused with a physical phase change of the material, e.g., from a solid to a liquid, etc. Furthermore, "conductor" and "dielectric," as used herein, are utilized as relative classifications, rather than absolute classifications, i.e., a dielectric being less electrically-conductive than a conductor.

The use of support materials with better etching characteristics may provide desired improvements. While such improvements may be particularly noticeable in HAR features, they may nonetheless be realized when etching features with lower aspect ratios.

The Figures herein follow a numbering convention in which the first digit or digits correspond to the drawing Figure number and the remaining digits identify an element or component in the drawing. Similar elements or components between different Figures may be identified by the use of similar digits. For example, 110 may reference element "10" in FIG. 1, and a similar element may be referenced as 210 in FIG. 2. It should also be apparent that the scaling on the figures does not represent precise dimensions of the various elements illustrated therein.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1B:
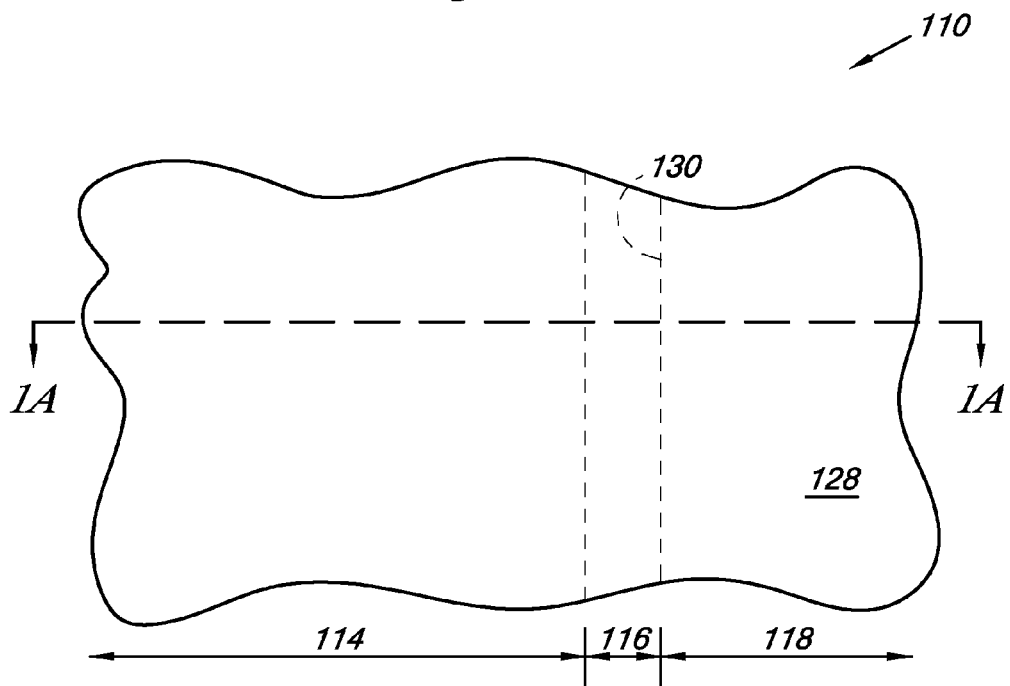
FIG. 1B is a diagrammatic top view of a portion of the semiconductor wafer at a preliminary processing stage of an embodiment.

In the embodiment of FIGS. 1A and 1B, a portion of a semiconductor wafer 110 is shown at a preliminary processing stage of an embodiment. Portion 110 includes a substrate 112. Substrate 112 includes a semi-conductive material. To aid in interpretation of the claims that follow, the terms "semi-conductive" and "semiconductor" substrate are defined to mean any construction comprising semi-conductive material, including, but not limited to, bulk semi-conductive materials such as a semi-conductive wafer (either alone or in assemblies comprising other materials thereon), and semi-conductive material layers (either alone or in assemblies comprising other materials). The term "substrate" refers to any supporting structure, including, but not limited to, the semi-conductive substrates described above.

In the embodiment of FIGS. 1A and 1B, substrate 112 is divided into three defined regions 114, 116 and 118. Region 114 corresponds to a memory array region. Region 118 corresponds to a region other than the memory array region, and can correspond to, for example, a so-called peripheral region. The region is referred to as a peripheral region because it is peripheral to the memory array region. Typically, logic circuitry and other circuitry associated with the control of data flow to and from memory devices associated with memory array region 114 would be associated with peripheral region 118. Region 116 corresponds to a location between the memory array region 114 and the peripheral circuitry associated with region 118. Dashed lines are provided through portion 110 to roughly indicate the various defined regions 114, 116 and 118 extending within the structure. Various circuit devices (not shown) could be associated with peripheral region 118 at the processing stage of FIGS. 1A and 1B.

In the embodiment of FIG. 1A, a plurality of electrically conductive node locations 120, 122, 124 and 126 are shown within memory array region 114 of substrate 112. Node locations 120, 122, 124 and 126 can correspond to, for example, conductively-doped diffusion regions within a semi-conductive material of substrate 112, and/or to conductive pedestals associated with substrate 112. Although the node locations are shown to be electrically conductive at the processing stage of FIG. 1A, it is to be understood that the electrically conductive materials of the node locations could be provided at a processing stage subsequent to that of FIG. 1A (not shown).

Node locations 120, 122, 124 and 126 can ultimately be electrically connected with transistor constructions (not shown in FIG. 1A) and can correspond to source/drain regions of the transistor constructions, or can be ohmically connected to source/drain regions of the transistor constructions. Transistor gates and other components of the transistor constructions can be present within memory array region 114 at the processing stage of FIG. 1A, or can be formed in subsequent processing.

As shown in the embodiment of FIGS. 1A and 1B, an etch stop layer 130 and/or support material 128 is formed over substrate 112. Support material 128 can comprise a single layer (as shown) of homogeneous or non-homogeneous material, e.g., a mixture, multiple layers of a single homogeneous or non-homogeneous material, or multiple layers of differing composition and/or physical properties.

According to one or more embodiments, support material 128 is a conductive polymer that is stable to 375 degrees C., and is capable of being formed and initially cured, i.e., to an electrically conductive solid, to a post-cure/PEB thickness of at least 3 microns without cracking. According to one or more embodiments, support material 128 is capable of being formed and initially cured to a post-cure/PEB thickness of 3-4 microns without cracking. According to one or more embodiments of the present disclosure, the support material 128 is formed of a conductive polymer blended with a polymer matrix in order to achieve a desired thickness, as needed for formation of particular features.

Support material 128 can include of one or more electrically insulative and/or electrically conductive materials. In particular, support material 128 may contain at least 20 at % carbon. While 20 at % carbon may be suitable for either insulative or conductive materials, a support material with higher carbon content might contribute to increased conductivity, depending upon the other materials. Consequently, in the case of electrically conductive materials, support material 128 may contain at least 25 at % carbon. According to one or more embodiments, e.g., in the case of electrically conductive materials, support material 128 may contain at least 50 at % carbon.

The carbon may be primarily in the form of an electrically conductive, carbon backbone polymer or a hydrocarbon-containing, silicate backbone polymer, with or without a polymeric carrier "matrix," e.g., as a mixture or blend. Although the silicate backbone polymer may be electrically insulative, such polymers are typically electrically conductive. Silicate backbone polymers are known containing as much as 36 at % carbon, but may or may not be conductive.

According to one or more embodiments, support material 128 is electrically conductive, such that feature charging may be reduced. As a result, vertical and/or lateral potential gradients may be reduced, addressing the problems of aspect ratio dependent etch and twisting. Reduction of feature charging thus becomes especially significant for high aspect ratio features. In the case where support material 128 is electrically conductive feature charging may be beneficially reduced.

According to one or more embodiments, support material 128 may further include titanium and/or silicon. The silicon may be primarily in the form of the hydrocarbon-containing, silicate backbone polymer. Alternatively, the silicon may be in another form, for example, in combination with an electrically conductive, carbon backbone polymer. The titanium and/or silicon may be in the form of oxides, which are insulative, or in other forms, which may be insulative or conductive. Titanium and/or silicon may be provided to increase the rigidity of support material 128 beyond the rigidity otherwise exhibited in the absence of titanium and silicon. A more rigid support material 128 may improve stability during subsequent processing. An amount of titanium and/or silicon may be selected to produce the desired effect.

In an example embodiment where support material 128 does not include titanium, the silicon might not exceed 26 at %. In an example embodiment where support material 128 does not include silicon, the titanium might not exceed 12 at %. In an example embodiment where support material 128 includes both titanium and silicon, the titanium might not exceed 7.7 at % and silicon might not exceed 12.5 at %.

According to one or more embodiments, the support material 128 is non-crystalline. For example, support material 128 may consist of amorphous carbon, intermediate carbon, transparent carbon, or a combination thereof. In the context of the present disclosure, "amorphous" carbon refers to carbon that is not crystalline. That is, amorphous carbon includes "transparent" carbon which has some structural regularity due to an increased prevalence of $sp^3$ hybridized bonding (four single bonds per carbon). However, transparent carbon does not exhibit the high degree of structural regularity well known as characteristic of crystalline carbon, for example, diamond, graphite, etc. In comparison, fully amorphous carbon has no structural regularity due to an increased prevalence of $sp^2$ hybridized bonding (one double bond and two single bonds per carbon) and literally "lacks definite form," i.e. is amorphous. Fully amorphous carbon thus includes more aromatic and/or unsaturated hydrocarbons. Understandably, amorphous carbon also includes "intermediate" carbon positioned between fully amorphous carbon and crystalline carbon with regard to its structural regularity. Transparent carbon is thus within the realm of and is one type of intermediate carbon.

One example of transparent carbon contains about 55 at % carbon and about 40 at % hydrogen with the remainder nitrogen and/or oxygen. One example of fully amorphous carbon includes about 70 at % carbon and about 25 at % hydrogen with the remainder nitrogen and/or oxygen. Consequently, support material 128 may consist of from about 55 to about 70 at % carbon, about 5 at % or less of nitrogen, oxygen, sulfur, metals, and semimetals (any of which may be absent), and the remainder hydrogen. "Semimetals" commonly refers at least to boron, silicon, arsenic, selenium, and tellurium.

According to one or more embodiments, forming support material 128 may include applying a liquid, or viscous, mixture to substrate 112 and initially curing the liquid mixture into a solid. Application of the liquid mixture may be accomplished by spin-on techniques, as the same will be appreciated by one of ordinary skill in the art. Forming support material 128 might be accomplished using other techniques, for example, chemical vapor deposition (CVD), etc. Known CVD techniques for depositing transparent carbon include plasma enhanced CVD and thermal CVD. Plasma enhanced CVD of transparent carbon often occurs at about 375° C.

The liquid mixture may be a mixture of polymer solids and a carrier, and, optionally, a cross-linking agent and/or a catalyst. Potentially suitable liquid mixtures include anti-reflective coating (ARC) material mixtures and/or hard mask (HM) material mixtures. Liquid mixtures known for use in forming anti-reflective coatings and/or hard masks, instead of forming support materials, might be processed largely according to a manufacturer's specifications, including a series of heated baking and/or curing stages. Such initial processing may evaporate the carrier and other components while cross-linking and/or catalytically reacting, e.g., polymerizing, the polymer solids, leaving behind a support material in keeping with the embodiments herein. According to one or more embodiments of the present disclosure, such initial processing does not alter the initial conductivity properties of the support material; or if altered somewhat, the support material maintains essentially conductive conductivity characteristics sufficient to achieve high aspect ratio etching with chemically driven plasma with minimal twisting deformities.

As further appreciated from the discussion herein, alteration of known liquid mixtures and/or the manufacturer's recommended processing may be useful to most effectively obtain a desired support material. In addition to composition of the liquid mixture, consideration may be given to selection of cure temperature and cure time as potentially affecting composition and/or electrical characteristics of resulting support materials. For example, curing conditions may influence the type of bonding and/or cross-linking in the support material. Also, for spin-on application, consideration may be given to selection of viscosity, spin speed (revolutions per minute), and dispense volume as affecting thickness of resulting support materials.

Curing of the support materials may occur in one or more steps, stages or processes. An initial cure may be used to transform the deposited liquid mixture into a solid having conductive electrical properties. Subsequent curing steps or processes may then effect additional changes to the support materials composition and/or electrical characteristics. For example, these electrical characteristic changing curing steps may include any single step, or combination of steps, of heating, photon bombardment, irradiation, and/or exposure to electromagnetic fields, to achieve the desired material electrical property changes such as reducing conductivity of the support material.

Whereas initial curing processes to solidify the support material from a liquid to a solid generally might occur before feature formation therein, e.g., etching, subsequent curing processes, such as those set forth above, may be performed after certain features are formed in the support material. For example, after forming, e.g., etching, an opening in the solid support material, further processing of the support material, e.g., curing, may be accomplished to effect a reduction in conductivity of the support material. After such further processing of the support material, a capacitor structure may be formed in the opening, with the capacitor implemented having the now reduced-conductivity support material isolating container structures.

Embodiments of the present disclosure are not limited to capacitor structures. Other integrated circuit structures and features which may benefit from the advantages which may be realized by etching a material having more conductive electrical characteristics, and more insulative, i.e., less conductive, post-etch material electrical characteristics, are contemplated by the present disclosure. For example, substrates, fins, structural supports, isolation trenches, floating gate insulators, and other charge insulating structures and features are all contemplated by the present disclosure.

Various formulations of initially-conductive materials, which are capable of further, e.g., post-etch, processing to reduce material conductivity are possible. The exact formulation of the mixture may depend on the features to be formed therein, and the conditions encountered in processing other materials involved in the semiconductor fabrication. Support material mixtures having a range or variety of initial and subsequent conductivity are contemplated.

For any particular application, the support material mixture has an initial conductivity large enough to mitigate twisting and other feature distortions during etching or formation, to the degree required in the particular application. A particular support material mixture should be sufficiently easy to etch in oxygen containing plasma via chemically driven, e.g., O radical, reactions. The support material mixture may be cured to effect a change of conductivity, e.g., reduction, to a level sufficient to provide the insulation desired of the particular feature being formed. For example, a capacitor structure may call for less-conductive post-etch electrical characteristics than an isolation structure at one end of a number of memory device structures.

According to one example embodiment, the initially-conductive material mixture is a blend of a conductive polymer and a polymeric carrier "matrix." Certain properties of the blend may be changed by subsequent processing. For example, a conductivity change, e.g., a reduction, may be obtained by processing the mixture to cause a separation of the conductive polymer and the matrix polymer into separate micelles.

However, embodiments of the present disclosure are not limited to such mixtures, and may include any number of constituent polymers and/or non-polymer materials. Processing used to change conductivity after etching may rearrange polymer structures of one or more constituents of the mixture, or may cause micro or macro separation of certain mixture constituents. For example, heating, irradiation, photon bombardment, and/or electric and/or magnetic field exposure may be used to break molecules, and/or to separate the conductive polymer and the matrix polymer into separate micelles.

One such blend available from Brewer Science, Inc. of Rolla, Mo. has an initial resistance of approximately 1E7 ohms/square, and a conductivity of approximately 2.5E-3 S/cm (Siemens per centimeter), which is on the order of crystalline silicon (c-Si) having a conductivity of approximately 12E-3 S/cm. According to one embodiment of a fabrication method, the mixture is deposited and initially cured to a solid support material. The solid support material is etched to form various features, e.g., one or more capacitor structures. Subsequent to feature formation, the support material is exposed to a 180 degree C. bake, which increases the resistance, i.e., reduces the conductivity, of the blend by 4 orders of magnitude, i.e., 4 decades, to more than 10E11 ohms/square.

In certain applications and structures, the increase in resistance to more than 10E11 ohms/square, i.e., reduction in conductivity, may be sufficient to isolate devices, despite being two to three decades below the characteristics of $SiO_2$. Additional insulative qualities of the support material, e.g., higher post-curing resistivity, may be achieved with other mixtures, and/or by other curing processes such as longer bake times, higher bake temperatures, among others.

The reduction in conductivity, i.e., increase in resistivity, effected by curing is not due to massive thermal degradation, or volatilization of the support material. Due to the precise nature of feature formation, loss of mass of the support material is undesirable. Heating times and/or temperatures, or other curing process parameters, are maintained within a range that will not result in massive thermal degradation, or volatilization of the support material. For example with respect to the blend available from Brewer Science, Inc. described above, little mass loss occurs at curing temperatures of approximately 196 degrees Celsius, e.g., less than 10% mass loss observed with curing temperatures less than 196 degrees C. Curing at temperature above 200 degrees Celsius, but less than 475 degrees Celsius, show less than 15% mass loss.

According to one particular embodiment, curing of the support material to effect a reduction in conductivity included heating to at least 180 degrees C., but to less than 200 degrees C., for up to 30 minutes.

In further respect to the blend available from Brewer Science, Inc. described above, curing at lower temperatures than 180 degrees resulted in less reduction in conductivity for a given time. For example, heating to 100 degrees C. for 30 minutes resulted in virtually no change in material resistivity; heating to 120 degrees C. for 30 minutes resulted in less than one (1) decade change in material resistivity; and heating to 140 degrees C. for 30 minutes resulted in just slightly more than one (1) decade change in material resistivity.

Examples of hard mask material mixtures include BSI.M05068B and BSI.S07051 of a proprietary composition available from Brewer Science, Inc. of Rolla, Mo. The former produces an organo-silicate hard mask material containing about 36 at % carbon while the latter produces an organo-titanate-silicate hard mask material containing about 22 at % carbon, with both being insulative. An example of an ARC material mixture includes BSI.M06089A of a proprietary composition also available from Brewer Science, Inc. The mixture produces an organic (no titanium or silicon) ARC material containing about 44 at % carbon, with the coating being conductive. Examples of known classes of conductive polymers include poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), and poly(para-phenylene vinylene)s.

According to one or more embodiments, support material 128 can have a thickness over substrate 112 of, for example, greater than about 1 micrometer (μm). Even so, the thickness might be less than about 3 μm or from 1.5 to 2 μm, according to a particular design rule.

As the reader will appreciate, the compositions discussed above for support material 128 and/or the liquid mixtures that might form it have not previously been considered for such a use. Previously, using silicon dioxide dielectric for support material provided easy isolation of array devices from peripheral devices. Also, silicon dioxide generally withstands subsequent high temperature processing. Consequently, no known consideration was given to using hydrocarbon-containing support material, especially if electrically conductive. While providing beneficial etch capabilities in forming various features, hydrocarbon-containing support material might not withstand high temperature processing as well and, if conductive, does not isolate peripheral, or adjacent, devices all by itself.

Figure 2A:
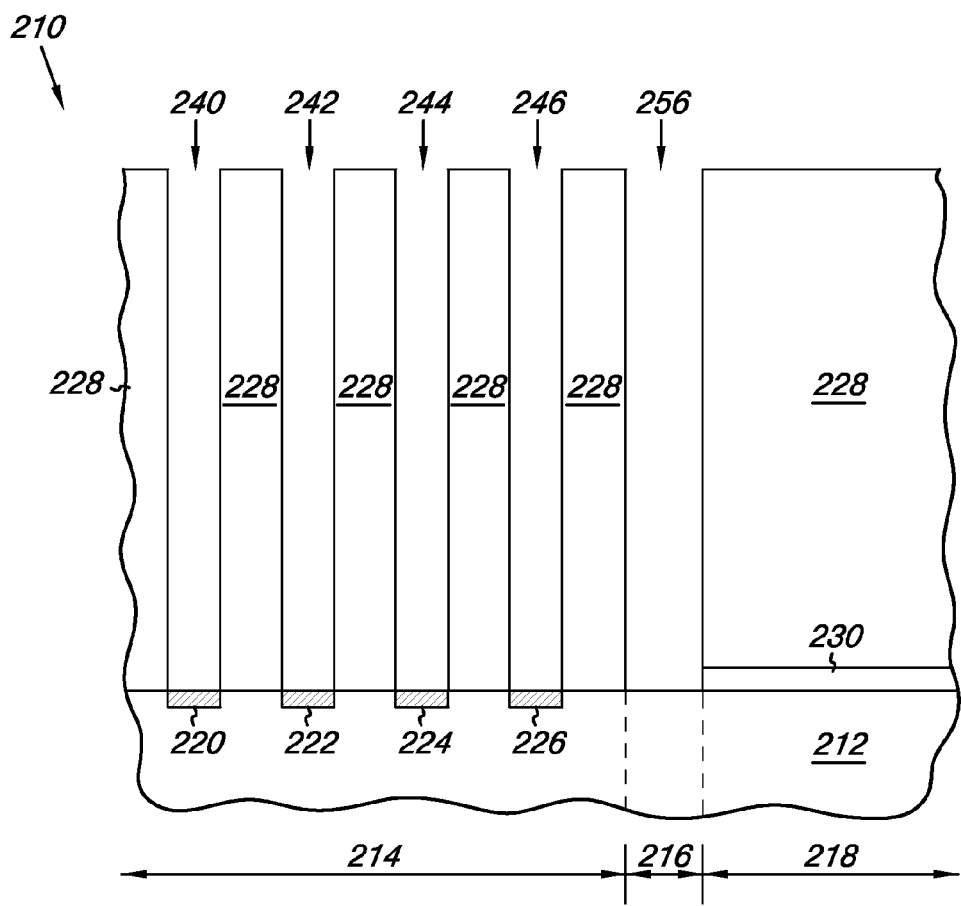
FIG. 2A is a diagrammatic, cross-sectional view of the FIG. 2B wafer portion comprising the cross-section shown in FIG. 2B along the line 2A-2A.
Figure 2B:
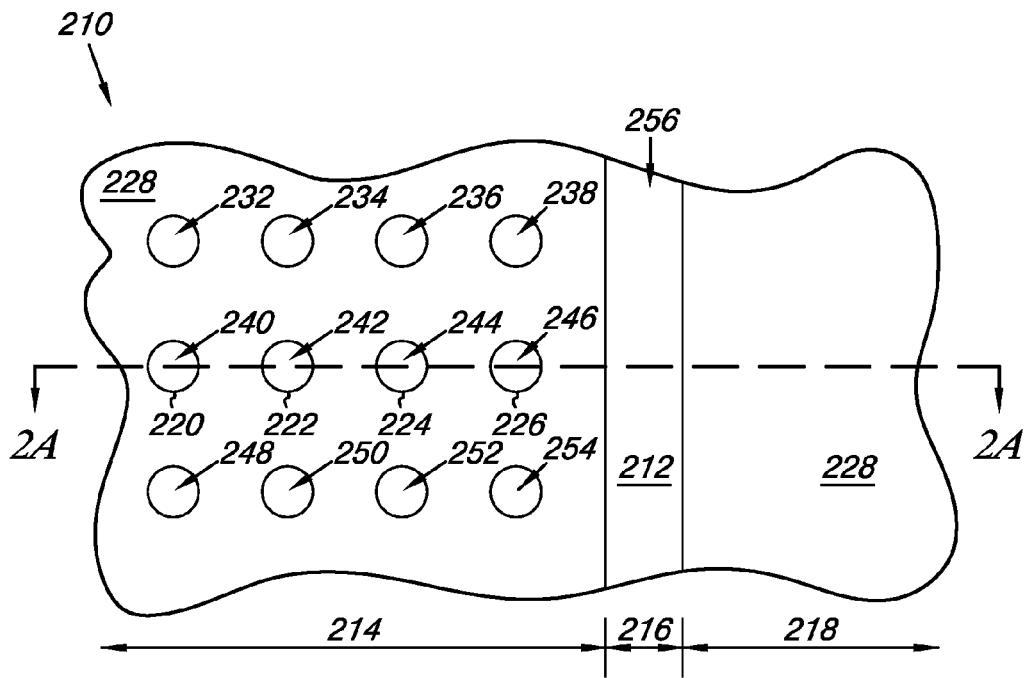
FIG. 2B is a diagrammatic top view of the wafer portion shown at a processing stage subsequent to that of FIG. 1B.

FIG. 2A is a diagrammatic, cross-sectional view of the FIG. 1A wafer portion 210 shown at a processing stage subsequent to that of FIG. 1A. A plurality of electrically conductive node locations 220, 222, 224 and 226 are shown within memory array region 214 of substrate 212. As illustrated in the embodiments of FIGS. 2A and 2B, openings 232, 234, 236, 238, 240, 242, 244, 246, 248, 250, 252, 254, etc., are formed through support material 228 to the node locations associated with an upper surface of substrate 212, (with node locations 320, 322, 324 and 326 being shown in FIG. 3A). According to one or more embodiments, the openings can have a high aspect ratio, meaning a ratio of about 20:1 or greater, e.g., a ratio of 70:1 or greater. The openings can have an elevation of from about 1 to about 3 μm, and a width of about 60 nanometers (nm) or less. The openings are shown to have circular outer peripheries (as illustrated by the top view of FIG. 2B), but it is to be understood that the openings can have other shapes. According to one or more embodiments, the openings 232, 234, 236, 238, 240, 242, 244, 246, 248, 250, 252, 254, etc., can be used to form containers of capacitor structures, as the same will be appreciated by one of ordinary skill in the art.

According to one or more embodiments, the openings 232, 234, 236, 238, 240, 242, 244, 246, 248, 250, 252, 254, etc., are formed over memory array region 214 of construction 210 and, while the openings are formed, a trench 256 is formed within region 216 of construction 210. Although trench 256 is shown formed simultaneously with the openings over memory array region 214, and accordingly is shown formed utilizing the same etch as that used to form the openings, it is to be understood that the trench can be, in alternative processing (not shown), formed with an etch separate from that used to form the openings over memory array region 214. Such etch used to form the trench can be conducted either prior to, or after, the etch used to form the container openings associated with memory array region 214. As one skilled in the art will appreciate, an array of memory cells (including associated capacitor structures), may be surrounded by a trench to provide physical isolation, for example as a barrier to keep the etchback, e.g., HF acid used with oxide support material, from attacking the periphery of the array.

According to one or more embodiments, formation of the container openings within memory array region 214 and the trench within region 216 may be accomplished by first forming a photoresist mask (not shown) with photolithographic processing, subsequently transferring a pattern from the patterned mask to underlying material 228, and removing the patterned photoresist mask. The photolithographic requirements associated with formation of the patterned mask can be relatively stringent and, accordingly, an antireflective coating material (not shown) can be incorporated into support material 228, formed beneath support material 228, or formed over support material 228. Of course, if support material 228 is itself an anti-reflective coating (ARC) material, then such measures might be omitted. In one or more embodiments, the ARC material may include a spin-on film, e.g., a bottom antireflective coating (BARC) material.

According to one or more embodiments, the support material 228 initially has relatively conductive electrical characteristics such that the openings may be anisotropically etched into support material 228. In such embodiments, the anisotropic etching may use a plasma generated from a gas composition containing $O_2$ along with $SO_2$, $SiCl_4$, $N_2$, or $N_2/C_xH_yF_z$, where x, y, and z are integers, $0 \leq x \leq 6$, $0 \leq y \leq 4$, and $0 \leq z \leq 8$. Examples of $C_xH_yF_z$ include $CH_2F_2$, $C_4F_8$, $C_4F_6$, $C_6F_6$ (aromatic), $C_5F_8$, etc. One set of possible anisotropic etching conditions includes supplying $O_2$ and $SO_2$ to an inductively coupled plasma reactor at a total flow rate of about 50 to about 300 standard cubic centimeters per minute (sccm) and a flow rate ratio of $O_2$ to $SO_2$ of 1:2 to 2:1.

Another set of possible anisotropic etching conditions includes supplying $O_2$ and $SiC_4$ to an inductively coupled plasma reactor at a total flow rate of about 500 to about 300 sccm and a flow rate ratio of $O_2$ to $SiCl_4$ of about 5:1. In either set, reactor temperature may be from about 20° to about 100° C. or, more specifically, from 50° to 70° C. Reactor pressure may be from about 5 to about 100 milliTorr or, more specifically, from 20 to 40 milliTorr. Power supplied to the top plate may be from about 500 to about 1200 watts (W) or, more specifically, approximately 850 W. Reactor bias may be from about 20 to about 200 volts or, more specifically, approximately 110 volts. One example of an inductively coupled plasma reactor includes a Lam 2300 Kiyo system available from Lam Research Corporation in Fremont, Calif.

A further set of possible anisotropic etching conditions includes supplying $O_2$ and $N_2$ to a capacitively coupled plasma reactor at a total flow rate of about 100 to about 500 sccm and a flow rate ratio of $O_2$ to $N_2$ of 1:2 to 2:1. A still further set of possible anisotropic etching conditions includes adding $CH_xF_y$, where x and y are integers from 0 to 4 and the sum of x and y equals 4, to the $O_2/N_2$ gas mixture to provide 10 to 50% of the total flow. In either set, reactor temperature may be from about 20° to about 100° C. or, more specifically, from 50° to 70° C. Reactor pressure may be from about 5 to about 100 milliTorr or, more specifically, from 20 to 40 milliTorr. The reactor may operate at dual frequency power with a high frequency power of about 200 to about 1000 W supplied at 27 to 160 megahertz (MHz) and a low frequency power of about 20 to about 1000 W supplied at 2 to 13.6 (MHz). One example of a capacitively coupled plasma reactor includes a Lam 2300 Exelan system available from Lam Research Corporation in Fremont, Calif.

The properties of support material 228 discussed above, especially with carbon primarily in the form of an electrically conductive, carbon backbone polymer, alone or in a blend, e.g., mixture, with a polymeric carrier matrix, may be expected to allow much higher aspect ratios than possible in silicon dioxide. The chemical component, as opposed to physical sputtering component, in anisotropic etching of support material 228 is larger than that of silicon dioxide ($SiO_2$). Such difference is even more dramatic for carbon backbone polymers. Support material 228 may thus be more effectively anisotropically etched at high aspect ratios.

In previous approaches, trench-style capacitors in crystalline silicon (c-Si) have reported aspect ratios of 70:1, with 100:1 demonstrated in research and development. However, in such approaches a silicon dioxide ($SiO_2$) support material does not allow nearly as high of aspect ratios due to the ease with which crystalline silicon (c-Si) may be removed compared to silicon dioxide ($SiO_2$). As such, according to one or more embodiments of the present invention, support material 228 may enable exceeding such aspect ratios given the properties described herein, which make it more amenable to effective anisotropic etching than crystalline silicon (c-Si).

Additionally, spin-on application of support material to a desired thickness and etching of openings may be integrated into a wider variety of process flows in comparison to forming trench-style capacitors in crystalline silicon. Further, for process flows forming buried digit lines, use of crystalline silicon would involve difficult and expensive epitaxial growth of the silicon. In the event that support material 228 without titanium and/or silicon produces "bowing" of a feature during etching, addition of titanium and/or silicon may decrease the lateral etch rate and help produce a straighter profile.

According to one or more embodiments, openings 232, 234, 236, 238, 240, 242, 244, 246, 248, 250, 252, 254, etc., are formed in an array within memory array region 214. Such array comprises rows and columns. The rows can be considered to extend horizontally in the view of FIG. 2B, and the columns can be considered to extend vertically in the view of FIG. 2B. Alternative array arrangements are possible, including offsetting each row by half of a cell compared to adjacent rows to allow higher cell density.

Although openings 232, 234, 236, 238, 240, 242, 244, 246, 248, 250, 252, 254, etc., are described as extending only through support material 228 to underlying conductive nodes, such as nodes 220, 222, 224, and 226 as shown in FIG. 2, it is to be understood that one or more other layers (not shown) can be provided between the nodes and support material 228 and that the openings can stop on the other layers. For instance, an etch stop layer (not shown) can be provided between support material 228, in FIG. 2A, and nodes 220, 222, 224, and 226, so that the openings stop on the etch stop layer. That is, an etch stop layer 230 is shown between support material 228 and region 218 of substrate 212 in FIG. 2A.

An etch stop layer can protect underlying materials, such as the surface of substrate 212 and/or electrical devices (not shown) supported by the surface, during a subsequent removal of support material 228 (discussed below). An etch stop layer may also mitigate effects of etch non-uniformities, if any. The openings can be extended through the etch stop and to nodes 220, 222, 224, and 226 with a second etch after the etch through support material 228. The etch stop can include any suitable material to which support material 228 can be selectively etched, and can, for example, be silicon nitride.

The figures that follow illustrate formation of capacitor structures in the openings in the support material. However, embodiments of the present invention are not so limited, and embodiments of the present disclosure include formation of other microelectronic structures as well. One skilled in the art will appreciate how aspects of the illustrated embodiments may be incorporated into the fabrication of other semiconductor features.

Following formation of the openings in the support material 228, such as by etching, further processing, e.g., curing, of the support material to effect a reduction in conductivity as described above, may be accomplished either before, during, or after any of the following capacitor fabrication steps. Depending on the particular application, or support material composition, or capacitor fabrication techniques, the supporting material 228 may, for example, be heated to change, e.g., reduce, the electrical conductivity properties of the support material. This processing or curing of the supporting material to have higher resistivity properties may be accomplished in one or more steps, all at one time, or in time-segregated processing steps.

According to one or more particular embodiments, after openings are formed, the support material is processed to effect a reduction in conductivity by heating the support material to at least 180 degrees C., but to less than 200 degrees C., for up to 30 minutes. Thereafter, fabrication of the capacitor structures illustrated in the following figures is accomplished. According to one or more embodiments, the capacitor structures illustrated in the following figures are fabricated, and then the support material is processed to effect a reduction in conductivity as detailed above. According to one or more embodiments, the support material 228 is subjected to photon bombardment, irradiation, and/or exposure to electromagnetic fields in addition to, or in lieu of, the heating process described above in order to effect a change in the electrical conductivity characteristics of the support material 228.

As one skilled in the art will appreciate, a conventional transparent, e.g., amorphous, carbon/anti-reflective coating (TC/ARC) masking strategy for forming the openings is not compatible with the heating process having the temperature profile(s) discussed above (used to reduce the conductivity of the support material). However, it will be appreciated that a TC is not a suitable masking technique for a polymer etch. Thus a low temperature ALD (atomic layer deposition) oxide might function better as the etch mask. Such ALD oxides can be deposited at temps as low as 50 degrees C. Depending on application, and feature configuration, an organic spin-on ARC could be used on top of the oxide if needed for photo resolution.

Figure 3A:
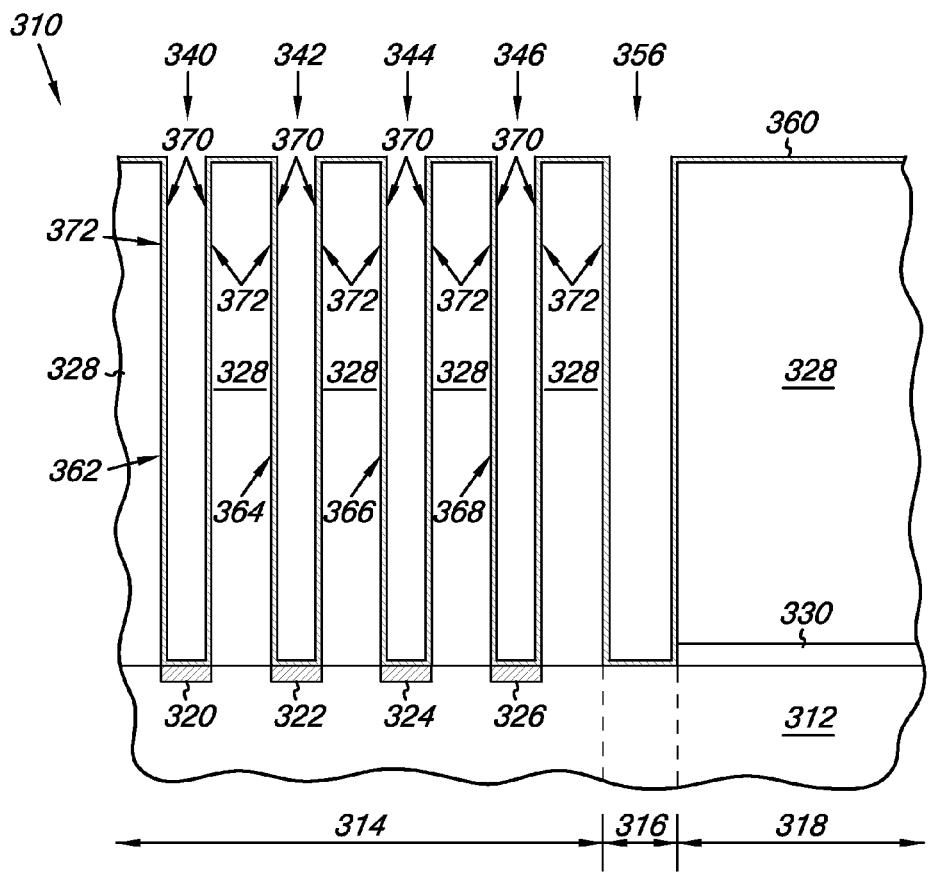
FIG. 3A is a diagrammatic, cross-sectional view of the FIG. 3B wafer portion comprising the cross-section shown in FIG. 3B along the line 3A-3A.
Figure 3B:
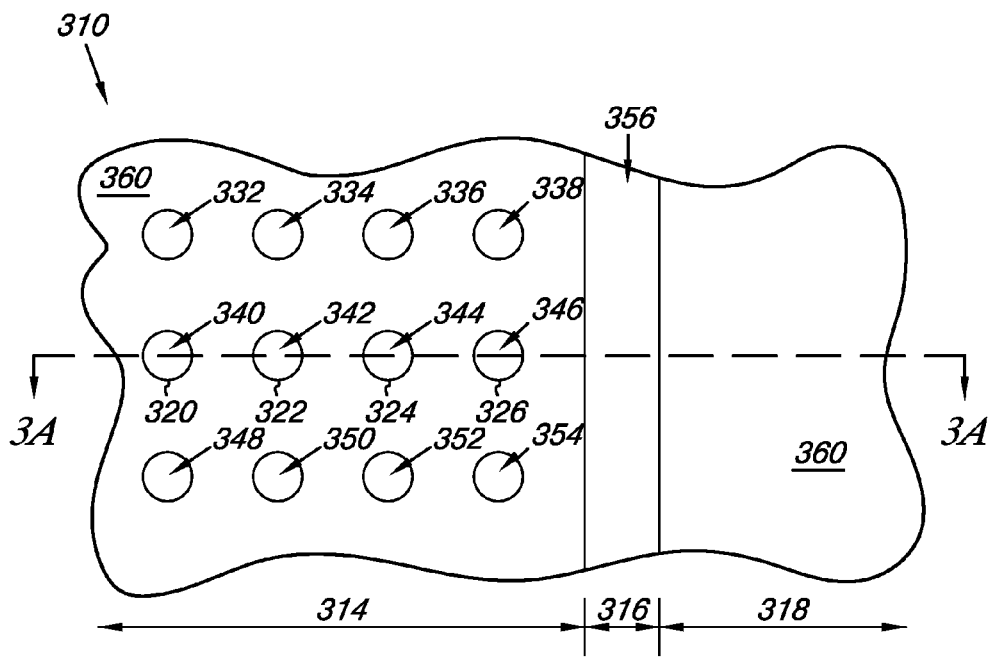
FIG. 3B is a diagrammatic top view of the wafer portion shown at a processing stage subsequent to that of FIG. 2B.

FIG. 3A is a diagrammatic, cross-sectional view of the FIG. 2A wafer portion 310 shown at a processing stage subsequent to that of FIG. 2A. A plurality of electrically conductive node locations 320, 322, 324 and 326 are shown within memory array region 314 of substrate 312. In the embodiments of FIGS. 3A and 3B, a conductive material 360 is formed within openings 332, 334, 336, 338, 340, 342, 344, 346, 348, 350, 352, 354, etc., as well as within trench 356. Electrically conductive material 360 can be a homogeneous composition of electrically conductive material, or can comprise multiple layers of electrically conductive material. The electrically conductive materials within material 360 can comprise any suitable materials, including, for example, metal, metal compounds, and conductively-doped silicon. For example, conductive material 360 may include titanium, titanium nitride, platinum, tungsten, silicon, ruthenium, etc.

According to one or more embodiments, portions of conductive material 360 within the openings in memory array region 314 can be considered to form container structures within the openings. For instance, FIG. 3A shows the portions of conductive material 360 within openings 340, 342, 344 and 346 corresponding to container structures 362, 364, 366 and 368. The container structures can be considered to include inner surfaces 370 within the openings and outer surfaces 372 laterally opposed to the inner surfaces. The outer surfaces 372 are shown in contact with, and extending along, support material 328 in FIG. 3A. However, other materials (not shown) might be formed between outer surfaces 372 and support material 328.

According to one or more embodiments, portions of conductive material 360 may ultimately be incorporated into a capacitor electrode, for example, a capacitor storage node. Accordingly, conductive material 360 may be referred to as capacitor electrode material, or as capacitor storage node material.

In the embodiment of FIGS. 3A and 3B, conductive material 360 is only shown to partially fill openings 332, 334, 336, 338, 340, 342, 344, 346, 348, 350, 352, 354, etc., and thus forms container structures within the openings. Alternatively, conductive material 360, either alone or in combination with other conductive materials, can completely fill the openings to form pedestal (or post) structures within the openings. The structures formed from conductive material 360 in the openings, i.e., the container structures or pedestal structures, can be referred to as capacitor structures, since they may ultimately be incorporated into capacitors.

Figure 4A:
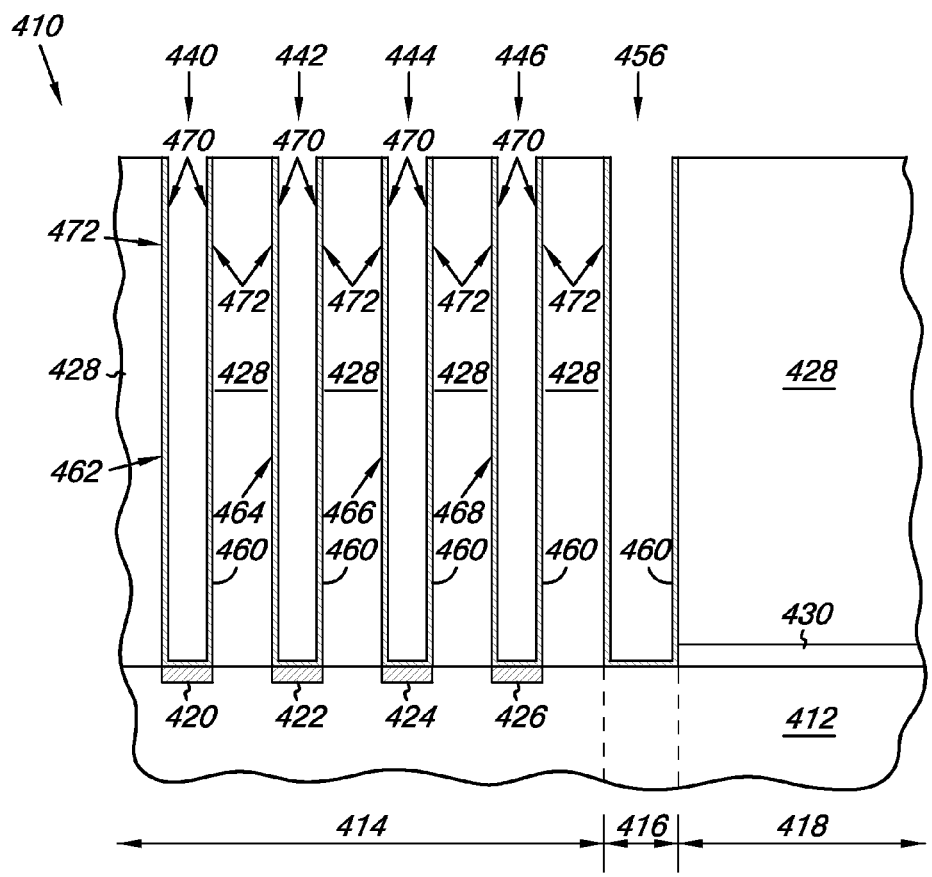
FIG. 4A is a diagrammatic, cross-sectional view of the FIG. 4B wafer portion comprising the cross-section shown in FIG. 4B along the line 4A-4A.
Figure 4B:
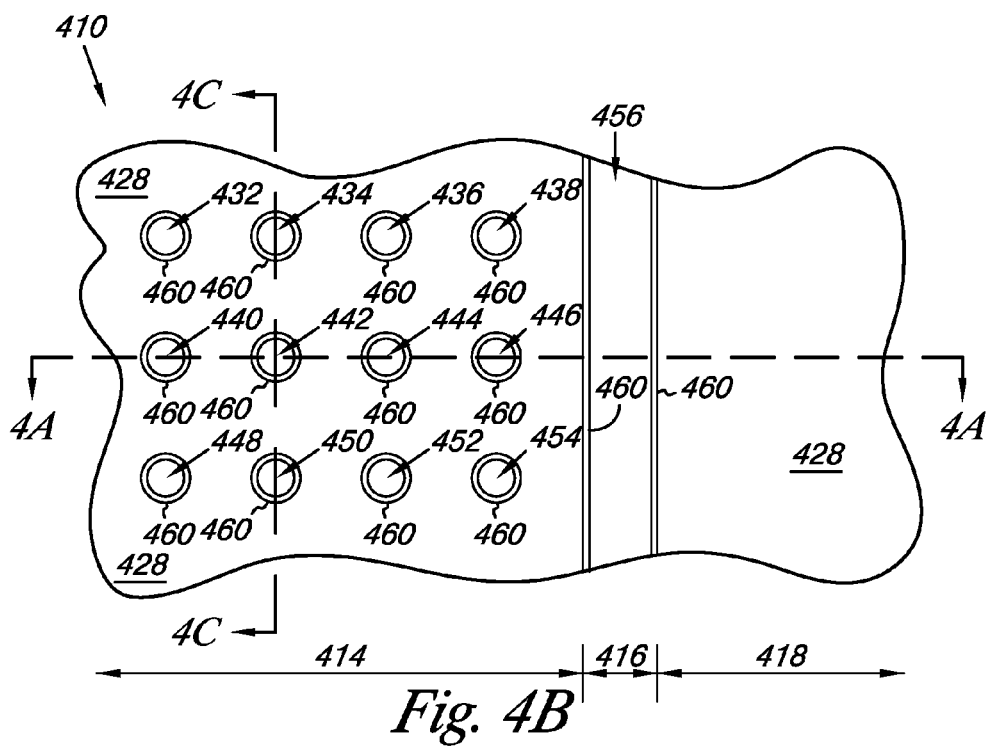
FIG. 4B is a diagrammatic top view of the wafer portion shown at a processing stage subsequent to that of FIG. 3B.
Figure 4C:
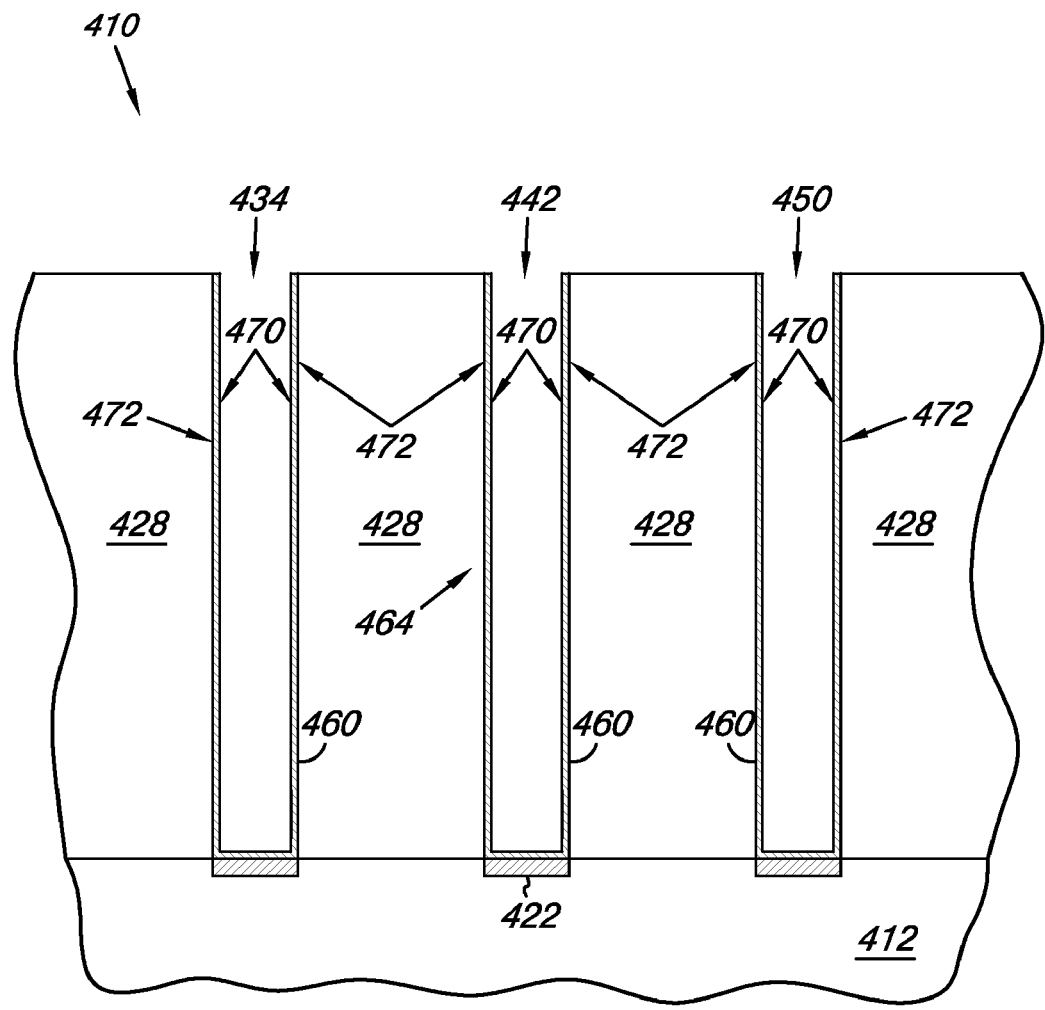
FIG. 4C is a diagrammatic, cross-sectional view along the line 4C-4C of FIG. 4B.

FIG. 4A is a diagrammatic, cross-sectional view of the FIG. 3A wafer portion 410 shown at a processing stage subsequent to that of FIG. 3A. A plurality of electrically conductive node locations 420, 422, 424 and 426 are shown within memory array region 414 of substrate 412. In the embodiment of FIGS. 4A-4C, portions of conductive material 460 outside of openings 432, 434, 436, 438, 440, 442, 444, 446, 448, 450, 452, 454, etc., are removed, which creates discrete capacitor structures (specifically, container structures) in the openings. The removing may be accomplished by chemical-mechanical planarization (CMP), dry etch back, wet etch back, etc. In the case of dry etch back, openings 432, 434, 436, 438, 440, 442, 444, 446, 448, 450, 452, 454, etc., and trench 456 may first be filled, e.g. with a resist, to avoid removal of conductive material therein. CMP may avoid the additional resist formation.

According to one or more embodiments, as shown in FIGS. 4A-4C, the remaining support material 428 is not intentionally removed. However, embodiments of the present invention are not so limited, and certain portions of the remaining support material 428 may be removed to further form other topographical structures (see further discussion below with respect to FIGS. 5A-5C).

As shown in FIGS. 4A-4C, the support material 428 remains opposing outer surfaces 472 of the capacitor structures (such as, for example, the container structures 462, 464, 466 and 468 of FIG. 4A). According to one or more embodiments, in FIGS. 4A-4C, support material 428 remains over a portion of memory array region 414. Additionally, according to one or more embodiments, support material 428 remains integral with, or adjacent, outer surfaces 472.

In the embodiment of FIGS. 4A-4C, support material 428 also remains over region 416 and peripheral region 418. Other steps may be taken, as necessary, to protect support material 428 over region 416 and/or peripheral region 418. Such protection may depend on whether or when support material 428 undergoes the changes to its electrical conductivity characteristics described above.

Conductive material 460 associated with individual containers shown in the embodiment of FIGS. 4A-4C bear the shape of an annulus or a ring. It is to be understood, however, that material 460 may be formed in different shapes. Also, as discussed previously, material 460 (alone or in combination with other conductive materials) may be in the shape of a pedestal instead of being in the shown shape of a container.

According to one or more embodiments of the present disclosure, the electrical conductivity properties of support material 428 are reduced at some point in the fabrication process, and thus, avoiding the need to remove the support material which might require wet or dry stripping. An example of removing the support material is provided in co-pending, commonly assigned U.S. application Ser. No. 11/971,138, entitled, "Capacitor Forming Methods", having common inventorship, filed Jan. 8, 2008. The reader will appreciate certain advantages and efficiency can be gained by the methods of the present disclosure over techniques which involve removing the support material.

Often, high aspect ratio structures, such as shown in the Figures, are provided with retaining structures to reduce toppling during processing. For simplicity, retaining structures are not shown herein but may be included according to known techniques.

Figure 5A:
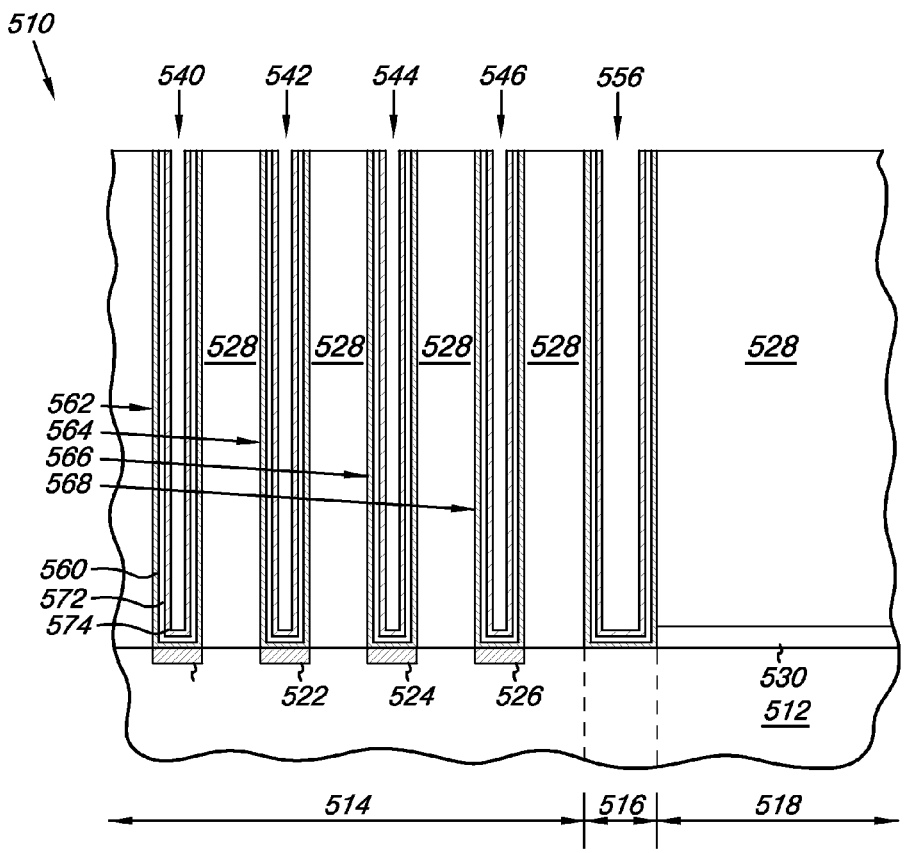
FIG. 5A is a diagrammatic, cross-sectional view of the FIG. 4A wafer portion comprising the cross-section shown in FIG. 5B along the line 5A-5A.
Figure 5B:
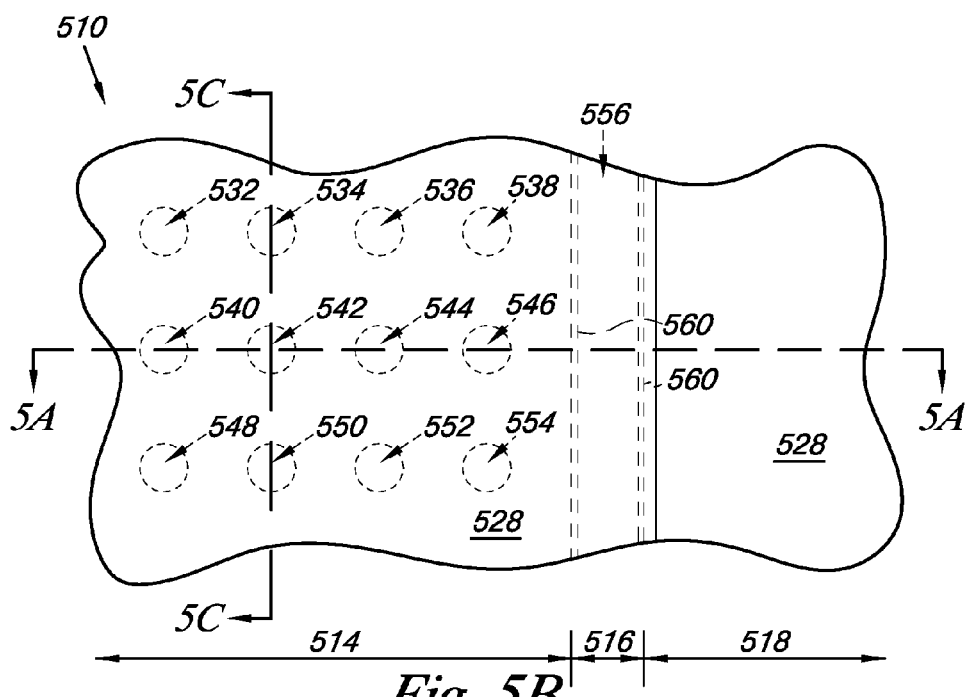
FIG. 5B is a diagrammatic top view of the wafer portion shown at a processing stage subsequent to that of FIG. 5B.
Figure 5C:
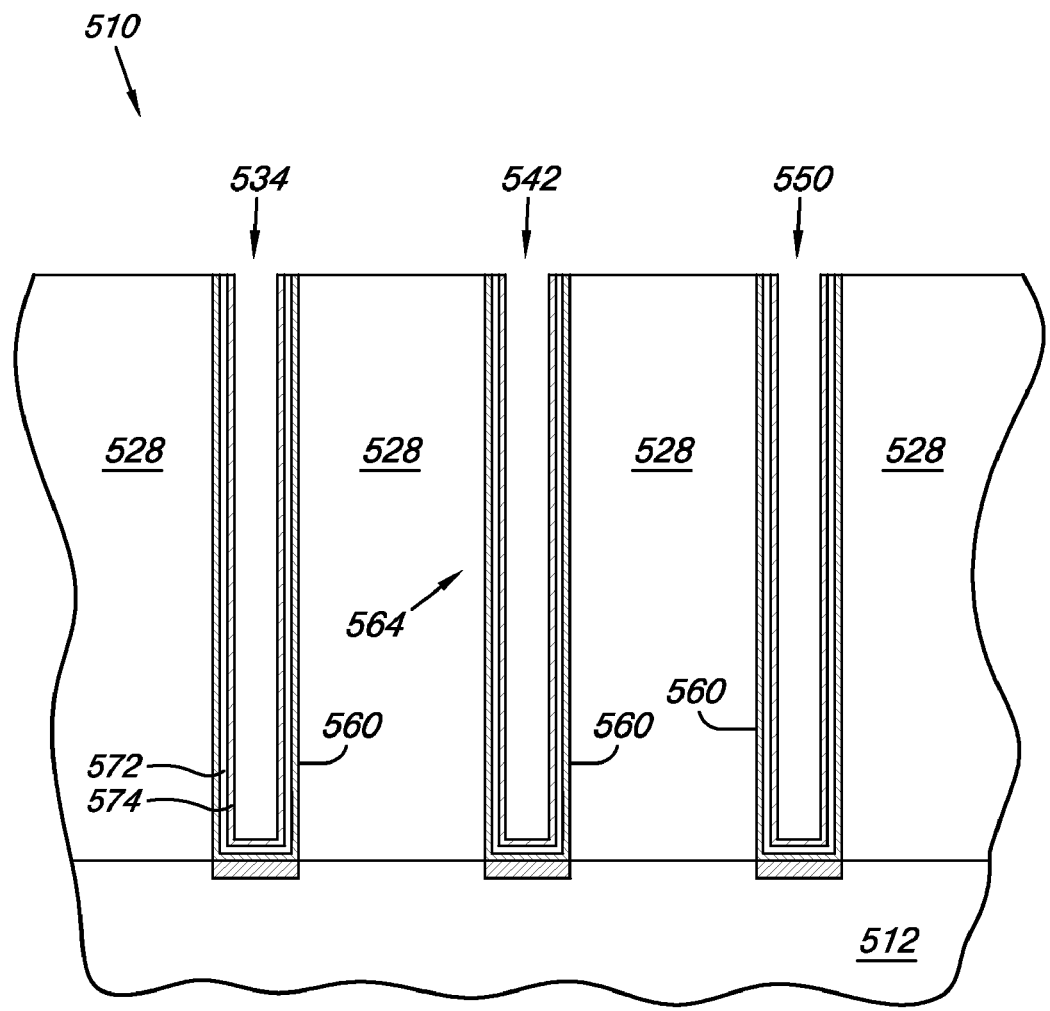
FIG. 5C is a diagrammatic, cross-sectional view along the line 5C-5C of FIG. 5B.

FIG. 5A is a diagrammatic, cross-sectional view of the FIG. 4A wafer portion 510 shown at a processing stage subsequent to that of FIG. 4A. A plurality of electrically conductive node locations 520, 522, 524 and 526 are shown within memory array region 514 of substrate 512. In the embodiment of FIGS. 5A-5C, a dielectric material 572 and a conductive material 574 are formed within openings 532, 534, 536, 538, 540, 542, 544, 546, 548, 550, 552, 554, etc. Conductive material 560 of the capacitor container structures can be referred to as a first capacitor electrode, and conductive material 574 can be referred to as a second capacitor electrode. The capacitor electrodes 560 and 574, together with dielectric material 572, form an array of capacitor structures, 562, 564, 566, and 568, within the array of openings 532, 534, 536, 538, 540, 542, 544, 546, 548, 550, 552, 554, etc. The openings, together with trench 556, are shown in phantom view in FIG. 5C to indicate that such are below conductive material 574 in the shown view. Although the shown capacitors are container capacitors, it is to be understood that in alternative embodiments the capacitors can also be pedestal capacitors, i.e., can comprise the dielectric material 572 and the conductive material 574 extending around pedestals of material 560.

According to one or more embodiments, additional portions of the remaining support material 528 may be removed after the openings, e.g., 532, 534, 536, 538, 540, 542, 544, 546, 548, 550, 552, 554, etc., and trench, e.g., 556, have been formed. For example, certain portions of the remaining support material 528 may be removed over the memory array region 514, but left intact in the peripheral region 518. According to one or more embodiments, portions of the remaining support material 528 may be removed before and/or after deposition and isolation, e.g., via CMP, of a lower capacitor cell plate, e.g., conductive material 560, to form double-sided containers. The portions of the remaining support material 528 may be removed in one or more removal steps. Thereafter, a dielectric, e.g., dielectric material 572, and an upper cell plate, e.g., conductive material 574, may be deposited so as to wrap around both sides of the double-sided container. One skilled in the art will appreciate that support material, e.g., 528, may still be left intact in the peripheral region 518 (as shown in FIGS. 5A-5B) to facilitate further circuit integration features. Fabrication of a capacitor structure using a double-sided container is further illustrated in FIGS. 6-8.

Figure 6:
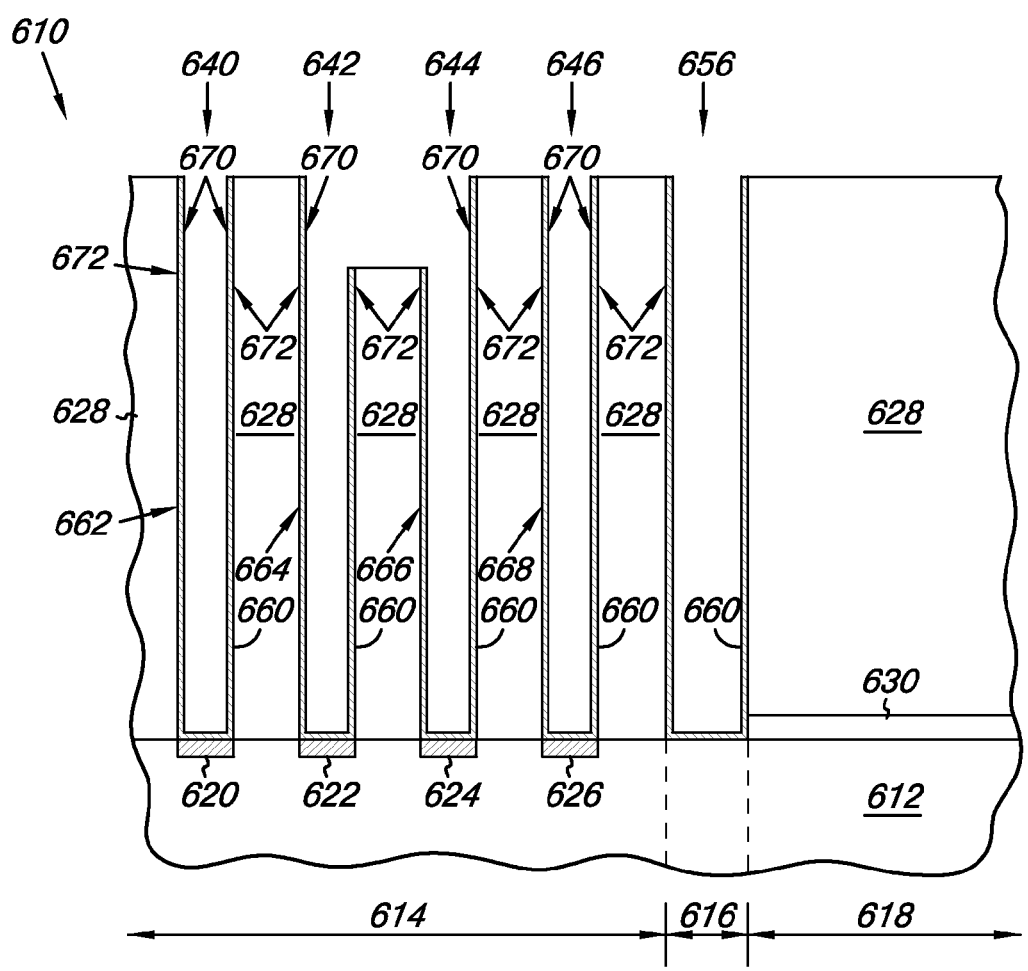
FIG. 6 is a diagrammatic, cross-sectional view of a wafer portion shown at a processing stage subsequent to that of FIG. 2A of an embodiment including formation of a double-sided container.

FIG. 6 is a diagrammatic, cross-sectional view of a wafer portion shown at a processing stage subsequent to that of FIG. 2A of an embodiment including formation of one or more double-sided containers. A plurality of electrically conductive node locations 620, 622, 624 and 626 are shown within memory array region 614 of substrate 612. As one skilled in the art will understand, a multiple sided container, e.g., a double-sided container, may be used to fabricate a capacitor structure with greater plate surface area, thus enabling greater capacitance in a single device.

As shown in FIG. 6, a portion of the support material 628, e.g., between openings 642 and 644, is removed to a desired depth, for example to provide adequate room above the area in which one or more double-sided container structures are being formed to achieve desired deposition distribution, and/or to accommodate certain structural features, and/or in light of other processing constraints.

A conductive material 660 is formed within openings 640, 642, 644, 646, etc., as well as within trench 656. Electrically conductive material 660 can be a homogeneous composition of electrically conductive material 660, or can comprise multiple layers of electrically conductive material (as was described above with regards to conductive material 360 in conjunction with FIGS. 3A and 3B).

Embodiments of the present invention are not limited to having to include the first additional removal of the support material 628 before forming the first cell plate, e.g., electrically conductive material 660. This step may be optional in certain fabrication processes, and/or capacitor configurations. Thus, according to one or more embodiments, this first additional removal of the support material 628, which effectively reduces the vertical surface area on which electrically conductive material 660 may be formed within openings 642 and 644, is omitted.

According to one or more embodiments, portions of conductive material 660 within the openings in memory array region 614 can be considered to form one or more container structures, and/or one or more double-sided container structures within the openings. For instance, FIG. 6 shows the portions of conductive material 660 within openings 640 and 646 corresponding to container structures 662 and 668, and within openings 642 and 644 corresponding to a double-sided container structures, e.g. 865 and 867 shown in FIG. 8, to be subsequently fabricated from container structures 664 and 668.

Figure 7:
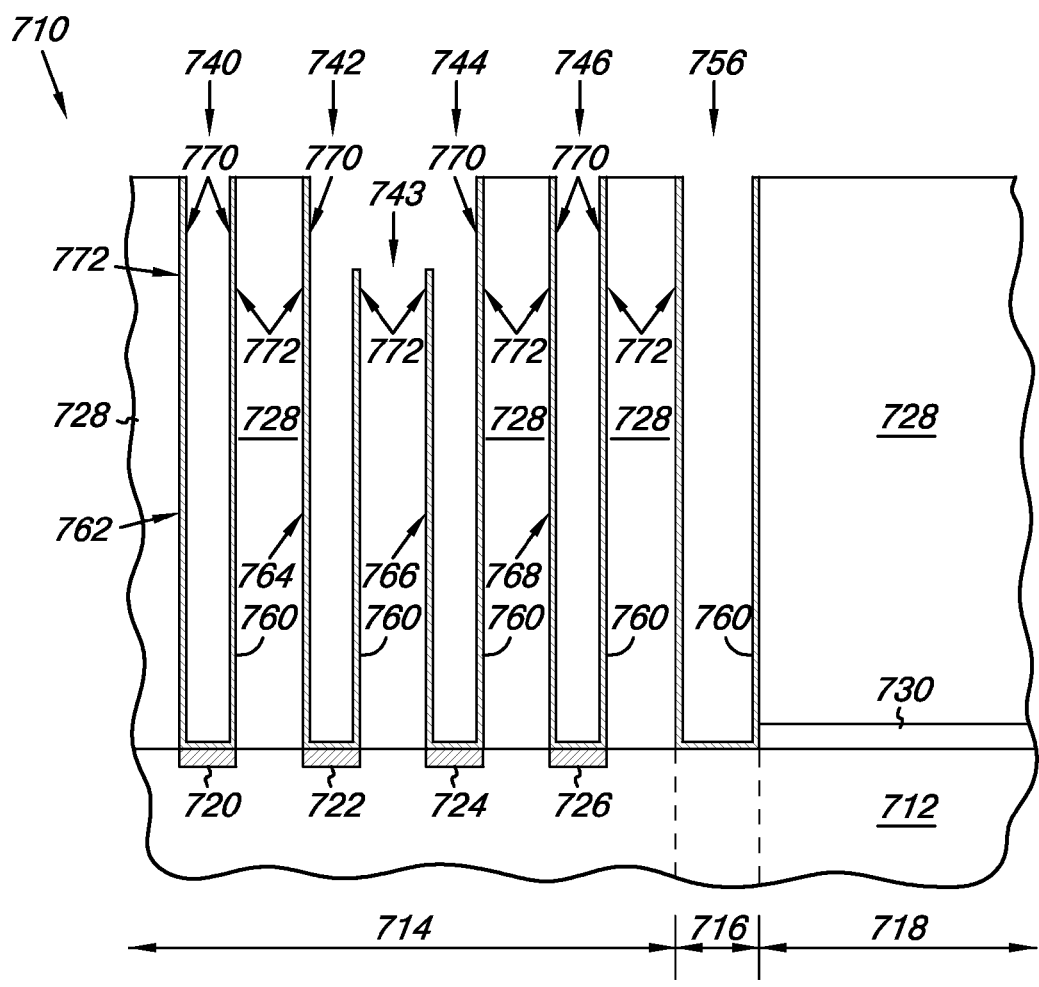
FIG. 7 is a diagrammatic, cross-sectional view of a wafer portion shown at a processing stage subsequent to that of FIG. 6 of an embodiment including formation of a double-sided container.
Figure 8:
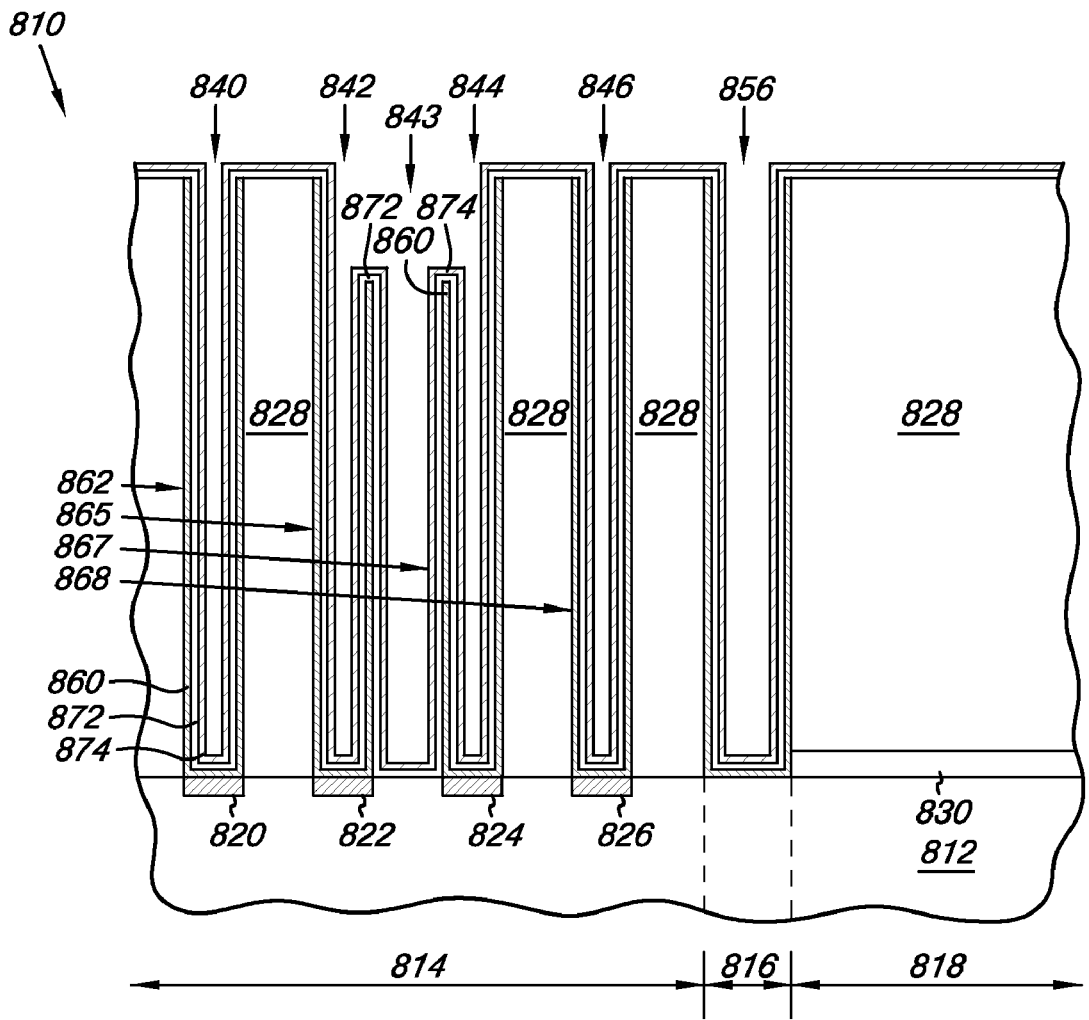
FIG. 8 is a diagrammatic, cross-sectional view of a wafer portion shown at a processing stage subsequent to that of FIG. 7 of an embodiment including formation of a double-sided container.

Although two double-sided container structures are shown being fabricated in FIGS. 6-8, embodiments of the invention are not so limited, and may include any number of container structures, any number of double-sided container structures, and/or any number of each in combination. Although both single-sided and double-sided container structures are shown being fabricated together in FIGS. 6-8, embodiments of the invention are not so limited, and a memory array may be formed using exclusively double-sided capacitor structures, surrounded by a trench, for example.

The container structures, including those that will ultimately be fabricated into double-sided container structures, can be considered to include inner surfaces 670 within the openings and outer surfaces 672 laterally opposed to the inner surfaces 670. The outer surfaces 672 contact and extend along support material 628. However, other materials (not shown) might be formed between outer surfaces 672 and support material 628. According to one or more embodiments, portions of conductive material 660 may ultimately be incorporated into a capacitor electrode, for example, a capacitor storage node (as is shown in the figures that follow). Accordingly, conductive material 660 may also be referred to as capacitor electrode material, or as capacitor storage node material.

In the embodiment of FIG. 6, conductive material 660 is only shown to partially fill openings 640, 642, 644, 646, etc., and thus forms the container structures within the openings. Alternatively, conductive material 660, either alone or in combination with other conductive materials, can completely fill the openings to form pedestal (or post) structures within the openings. The structures formed from conductive material 660 in the openings, i.e., the container structures or pedestal structures, can be referred to as capacitor structures, since they may ultimately be incorporated into capacitors.

FIG. 7 is a diagrammatic, cross-sectional view of a wafer portion shown at a processing stage subsequent to that of FIG. 6 of an embodiment including further processing towards formation of double-sided container structures, i.e., having not only the inner surfaces 770, but also at least one outer surface 772 of a container structure configured such that conductive material 760 may be formed thereon. A plurality of electrically conductive node locations 720, 722, 724 and 726 are shown within memory array region 714 of substrate 712. Once the conductive material 760 layer is formed on the support material, e.g., 628 shown in FIG. 6, for each container structure, e.g., 762, 764, 766, and 768, the support material 728 between container structures 764 and 768 is removed as shown in FIG. 7, for example by forming another opening, e.g., 743, between the conductive material 760 layers of container structures 764 and 766.

Opening 743 may be formed either before, or after, support material is cured by the methods discussed above to effect a reduction in conductivity. As one skilled in the art will appreciate, opening 743 may be formed using wet etch, or dry etch, techniques (among others), as may be appropriate to the conductivity of the support material at the time it is being removed. The forming of opening 743 exposes opposing outer surfaces 772 of container structures 764 and 766. As discussed above, the unsupported conductive material 760 layers may, or may not, be of a shorter vertical dimension than the conductive material 760 layers formed on, or adjacent to, the support material 728 between other container structures, e.g., between container structures 762 and 764, and between container structures 766 and 768.

FIG. 8 is a diagrammatic, cross-sectional view of a wafer portion shown at a processing stage subsequent to that of FIG. 7 of an embodiment including formation of one or more double-sided containers. A plurality of electrically conductive node locations 820, 822, 824 and 826 are shown within memory array region 814 of substrate 812. According to one or more embodiments, a dielectric material 872 and a conductive material 874 are formed within openings 840, 842, 843, 844, 846, etc., including over the top of the unsupported conductive material 860 layer bounding opening 843, as shown in FIG. 8. The dielectric material 872 and conductive material 874 may be formed over the remaining exposed top portions of remaining support material 828 (as shown) such that the dielectric material 872 and a conductive material 874 layers are common to all container openings, including double-sided container openings. However, embodiments of the present disclosure are not so limited, and according one or more embodiments, the dielectric material 872 and a conductive material 874 layers are not extended over the exposed top portions of remaining support material 828 between openings of one or more containers.

Conductive material 860 of the capacitor container structures can be referred to as a first capacitor electrode, and conductive material 874 can be referred to as a second capacitor electrode. The capacitor electrodes 860 and 874, together with dielectric material 872 therebetween, form number of capacitor structures, e.g., 862 within opening 840 and 868 within opening 846, and form a number of double-sided capacitor structures, e.g., 865 within openings 842 and 843, 867 within openings 843 and 844. Although the capacitor structures illustrated in FIG. 8 include capacitors formed using container structures and capacitors formed using double-sided container structures, it is to be understood that in alternative embodiments the various capacitors can also be pedestal capacitors, i.e., can comprise the dielectric material 872 and the conductive material 874 extending around pedestals of material 860.

According to one or more embodiments of the present disclosure, subsequent to the above-described etching and/or support material removal steps, any remaining support material, e.g., 828, may be cured by the methods discussed above to effect a reduction in conductivity. In this manner, isolation between discrete capacitor structures may be achieved without removing and replacing the support material used to form openings for the container structures and double-sided container structures. However, embodiments of the present disclosure are not so limited. For example, according to one or more embodiments, support material may be cured by the methods discussed above to effect a reduction in conductivity before support material, e.g., 728 in FIG. 7, is removed to form an opening, e.g., 743 in FIG. 7, as part of double-sided container fabrication.

According to one or more embodiments, transistor structures may be formed using similar techniques as described above with respect to capacitor structures. For example fin structures, e.g., for fin MOSFETs, fin FETs, and other vertical and horizontal transistor configurations, may be fabricated, e.g., etched, into a conductive support material, which is subsequently processed to effect a conductivity change to appropriately isolate such structures from one another or other devices. The reader will appreciate; the transistor devices and capacitor structures formed in accordance with the methodology described herein can be incorporated together into an array of memory cells, e.g., DRAM cells, SRAM cells, SDRAM cells, among others suitable high aspect ratio (HAR) uses. Embodiments of the present invention are not so limited.

CONCLUSION

The present disclosure includes methods, capacitors, and high aspect ratio (HAR) structures, e.g., contacts. One method embodiment includes a capacitor forming method includes forming an electrically conductive support material over a substrate, forming an opening through at least the support material to the substrate where the support material has a thickness and the opening has an aspect ratio of at least 20:1 within the thickness of the support material. After forming the opening, the method includes forming a capacitor structure contacting the substrate and the support material in the opening. The method includes effecting a phase change to the support material with the support material containing at least 25 at % carbon.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A capacitor forming method comprising:
   forming an electrically conductive support material over a substrate, the support material containing at least 25 at % carbon;
   forming an opening through at least the support material, the opening having an aspect ratio of at least 20:1 within a thickness of the support material;
   after forming the opening, processing the support material to effect a reduction in conductivity of the support material; and
   forming a capacitor structure in the opening.

2. The method of claim 1, wherein the method includes effecting the reduction in conductivity to the support material by heating the support material to approximately 180 degrees Celsius for approximately 30 minutes.

3. The method of claim 1, wherein the method includes effecting the reduction in conductivity by heating the support material to a temperature at least 180 degrees Celsius, but below 200 degrees Celsius, for approximately 30 minutes.

4. The method of claim 1, wherein the method includes effecting the reduction in conductivity to the support material using photon irradiation.

5. The method of claim 1, wherein the method includes effecting the reduction in conductivity to the support material using electromagnetic field exposure.

6. The method of claim 1 wherein the support material contains at least 50 at% carbon.

7. The method of claim 1 wherein the carbon is primarily in the form of an electrically conductive, carbon backbone polymer.

8. The method of claim 7 wherein the support material is a mixture of the conductive polymer and a polymeric carrier matrix.

9. The method of claim 8 wherein processing the support material causes a microphase separation of the conductive polymer and the carrier matrix polymer into separate micelles.

10. The method of claim 1 wherein the support material consists of from about 55 to about 70 at % carbon, about 5 at % or less of nitrogen, oxygen, sulfur, metals, and semimetals, and the remainder hydrogen.

11. The method of claim 1 wherein the support material is non-crystalline.

12. The method of claim 1 wherein the support material consists of amorphous carbon, intermediate carbon, transparent carbon, or a combination thereof.

13. The method of claim 1 wherein the support material further comprises titanium and/or silicon.

14. The method of claim 1 wherein the opening is formed only through the support material and the opening has a circular outer periphery.

15. The method of claim 1 wherein forming the opening comprises anisotropically etching the support material.

16. The method of claim 15 wherein the etching uses a plasma generated from a gas composition containing $O_2$ along with $SO_2$, $SiCl_4$, $N_2$, or $N_2/CH_xF_y$, where x and y are integers from 0 to 4 and the sum of x and y equals 4.

17. The method of claim 1 wherein the method includes:
foaming a second opening through at least the support material, the opening having an aspect ratio of at least 20:1 within a thickness of the support material;
forming a conductive cell plate layer in the openings; and
removing at least a portion of the support material between the openings to form a double-sided container structure before forming a dielectric layer over conductive cell plate layer or processing the support material to effect a reduction in conductivity.

* * * * *

UNITED STATES PATENT AND TRADEMARK OFFICE
CERTIFICATE OF CORRECTION

PATENT NO. : 8,274,777 B2  Page 1 of 1
APPLICATION NO. : 12/099577
DATED : September 25, 2012
INVENTOR(S) : Mark W. Kiehlbauch It is certified that error appears in the above-identified patent and that said Letters Patent is hereby corrected as shown below:

In column 20, line 8, in Claim 17, delete "foaming" and insert -- forming --, therefor.

Signed and Sealed this
Twentieth Day of November, 2012

David J. Kappos
*Director of the United States Patent and Trademark Office*